United States Patent [19]

Miyake

[11] Patent Number: 5,682,228
[45] Date of Patent: Oct. 28, 1997

[54] ALIGNMENT METHOD AND APPARATUS IN AN EXPOSING PROCESS

[75] Inventor: Eiichi Miyake, Hyogo-ken, Japan

[73] Assignee: Sanei Giken Co., Ltd., Amagasaki, Japan

[21] Appl. No.: 630,617

[22] Filed: Apr. 10, 1996

Related U.S. Application Data

[62] Division of Ser. No. 253,067, Jun. 2, 1994, Pat. No. 5,534,969.

[30] Foreign Application Priority Data

Jun. 2, 1993 [JP] Japan .................................. 5-131977
Sep. 6, 1993 [JP] Japan .................................. 5-221374

[51] Int. Cl.$^6$ ........................... G03B 27/42; G03B 27/62
[52] U.S. Cl. ........................................ 355/75; 355/53
[58] Field of Search .................................. 355/53, 75, 89, 355/95; 356/375, 400, 401; 250/548, 559.3

[56] References Cited

U.S. PATENT DOCUMENTS

| | | | |
|---|---|---|---|
| 5,144,363 | 9/1992 | Wittekoek et al. | 355/53 |
| 5,184,176 | 2/1993 | Unno et al. | 355/53 |
| 5,272,501 | 12/1993 | Nishi et al. | 355/53 |

FOREIGN PATENT DOCUMENTS 160539  9/1993  German Dem. Rep. .

*Primary Examiner*—Arthur T. Grimley
*Assistant Examiner*—Herbert Kerner
*Attorney, Agent, or Firm*—Wenderoth, Lind & Ponack

[57] ABSTRACT

An alignment apparatus includes holding devices for holding a photo-mask, a supporting device for supporting a substrate, a detecting device, and force-exerting devices. The photo-mask and the substrate have positioning marks, respectively. The detecting device detects positional errors between the positioning marks on the photo-mask and the positioning marks on the substrate. The force-exerting devices apply forces to a periphery of the photo-mask in accordance with the detected positional errors. When receiving forces, the photo-mask elastically deforms in its plane to move the positioning marks so that the positional errors can be corrected to predetermined values.

7 Claims, 19 Drawing Sheets

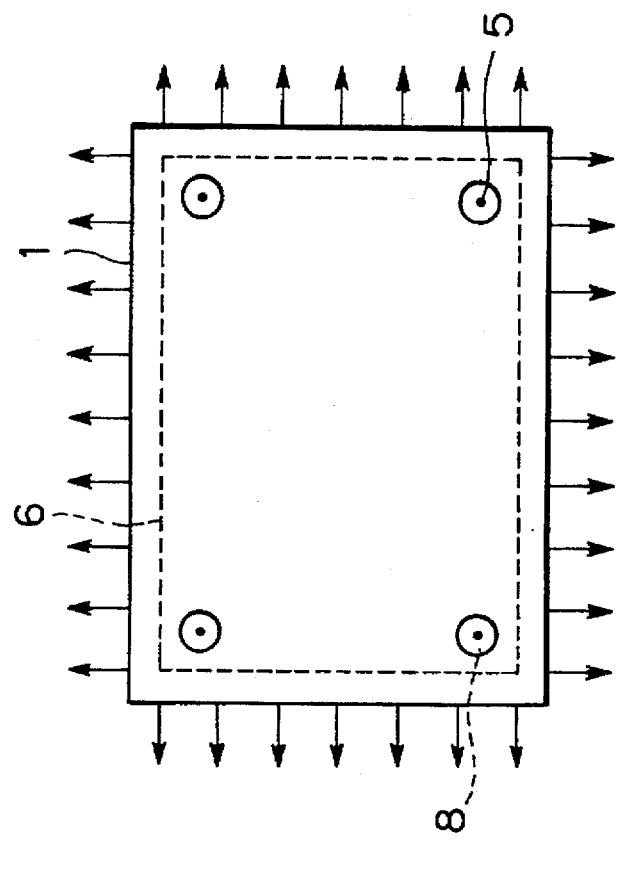
Fig. 3
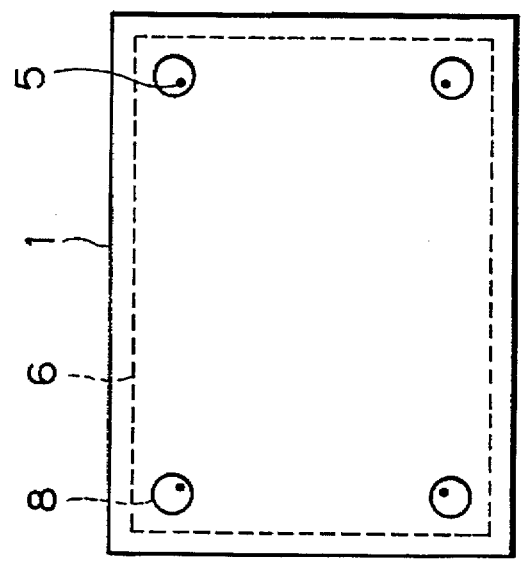

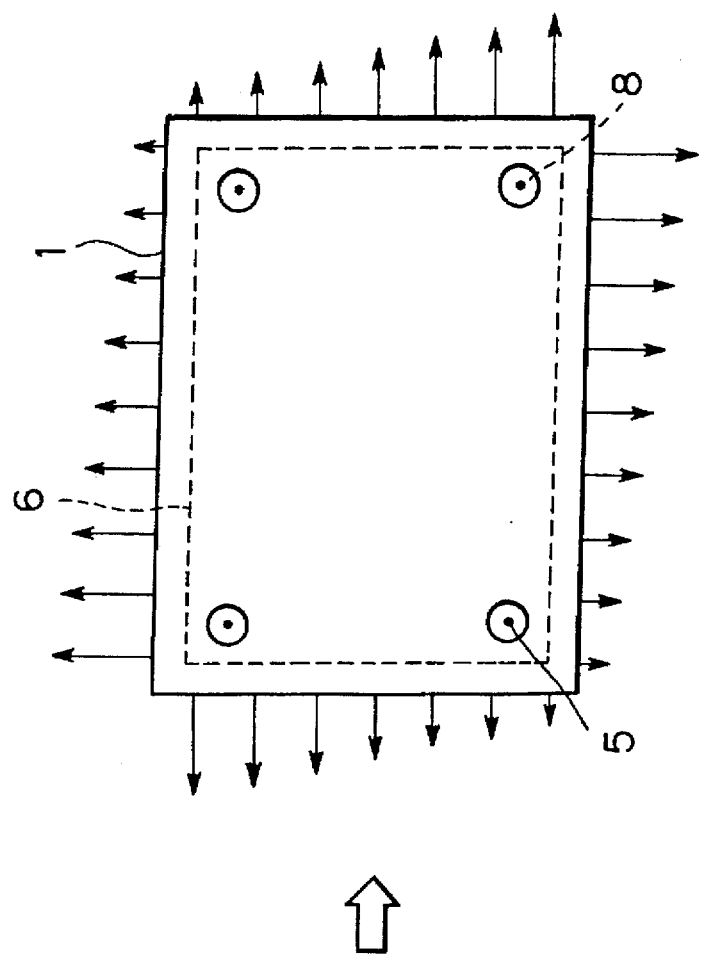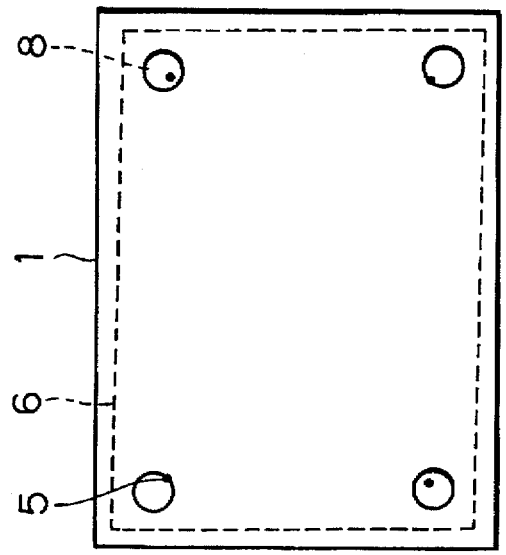
Fig. 4

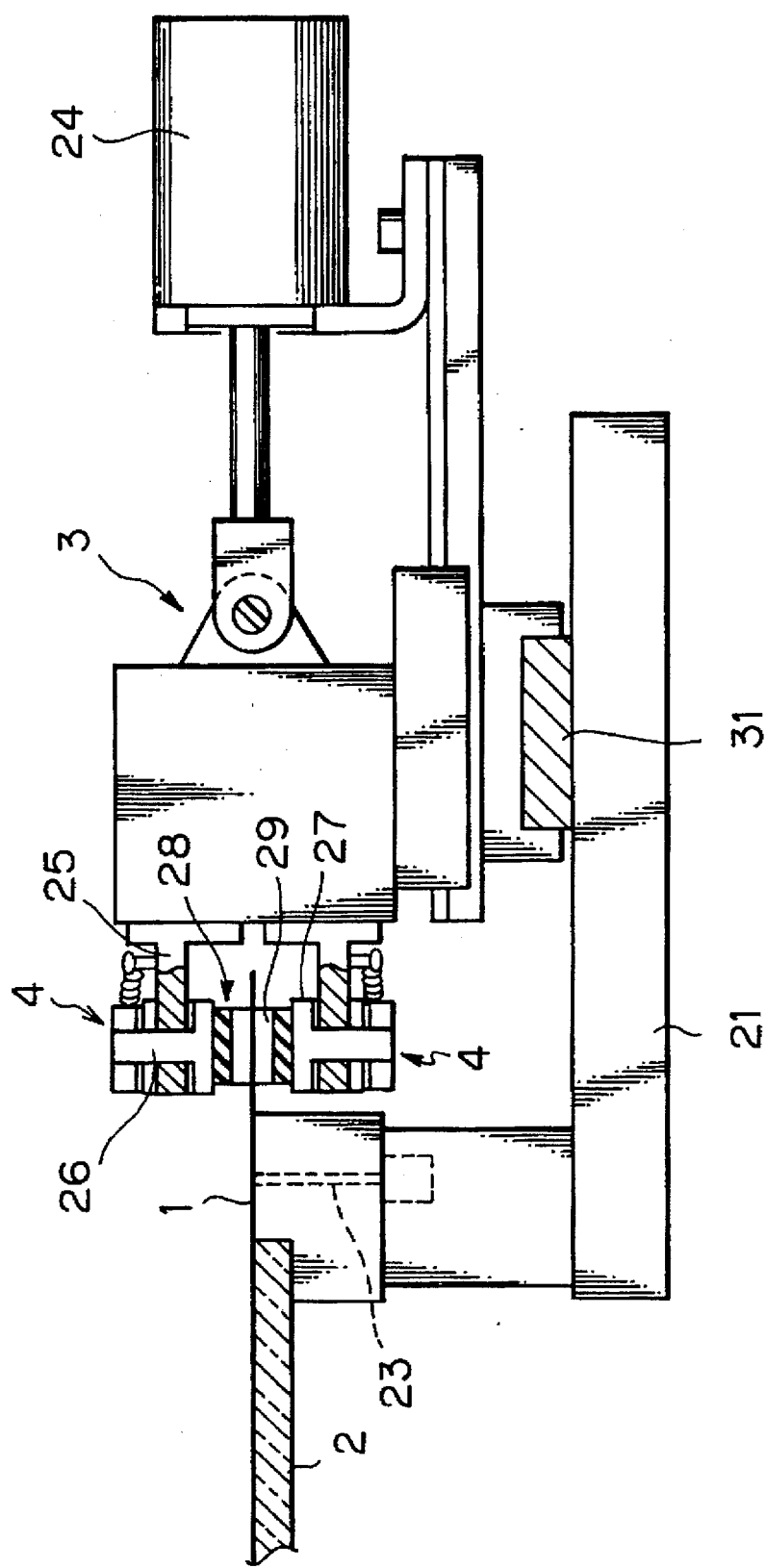

ALIGNMENT METHOD AND APPARATUS IN AN EXPOSING PROCESS

This is a divisional application of Ser. No. 08/253,067, filed Jun. 2, 1994, now U.S. Pat. No. 5,534,969.

FIELD OF THE INVENTION

1. Field of the Invention

This invention relates to an alignment method and apparatus for aligning a photo-mask with a substrate in an exposing process.

2. Description of the Related Art

When forming a conductive circuit pattern on a circuit board or forming electric poles on a glass substrate for flat displays, a pattern drawn on a photo-mask is transferred to a photo-sensitive surface of a substrate by utilizing a light exposure technique.

In the process of such exposure, it is essential for the substrate and the film-like, sheet-like or plate-like photo-mask to be properly aligned with each other. To assure this, a plurality of positioning marks are provided on both the substrate and the photo-mask so that when respective pairs of the positioning marks are aligned with each other the substrate and the photo-mask are properly aligned with each other.

Practically speaking, it is inevitable that when one pair of the positioning marks become aligned, another pair do not. This is attributable to many causes such as production errors in making the positioning marks, expansion or contraction of the substrate in a heat-treatment process, expansion or contraction of the photo-mask due to changes in ambient temperature or humidity, and so on. Such causes may be eliminated to some extent by intensively controlling the production processes. However, this is by no means a realistic solution because such severe control increases production costs considerably. Thus, in the prior art, alignment between the substrate and the photo-mask has been carried out by adjusting the position of the substrate relatively to the photo-mask so as to average positional errors at the respective pairs of the positioning marks.

However, the effect resulting from the above causes becomes greater as the size of the substrate increases. Thus, the positional errors become greater, and the averaged positional errors tend to go beyond the required tolerance. Further, when exposing high-density, high-precision patterns, the positional errors tend to exceed the tolerance, too. On the other hand, recently there has been an increasing demand for larger substrates and patterns of higher density and precision. Generally speaking, it is required that the accuracy of alignment between the substrate and the photo-mask is in the order of several micrometers to tens of several micrometers. However, the positional errors in a large substrate greater than approximately 50 square centimeters are in the order of tens of several micrometers to several hundred micrometers.

In the case where required accuracy cannot be achieved by the above-mentioned method of averaging positional errors, photo-masks having patterns of various scales may be used for the exposing process. This is, however, a time consuming process. It also complicates the whole process because the degree of deformation varies from substrate to substrate, and from one production lot to another.

SUMMARY OF THE INVENTION

A main object of the present invention is to provide an alignment method and a positioning apparatus that enables highly accurate and appropriate alignment between a photo-mask and a large substrate.

To achieve the above main object, the present invention provides an alignment method comprising the steps of: providing a photo-mask on which a pattern is drawn and which has a plurality of positioning marks; arranging a substrate which has a plurality of positioning marks corresponding to the positioning marks on the photo-mask so that a surface to be exposed of the substrate faces the photo-mask; detecting respective positional errors between the positioning marks on the photo-mask and corresponding positioning marks on the substrate; and exerting a force on one or more parts of a periphery of the photo-mask to elastically deform the photo-mask in its plane so that the positional errors are corrected to predetermined values.

The detection of the positioning errors can be made by processing image signals from a CCD camera directed to the positioning marks on the photo-mask and the substrate.

The force may be generated by actuating selected ones of a plurality of actuator assemblies which are mounted along the periphery of the photo-mask. The actuator assemblies are able to be individually actuated.

The selection of the actuator assemblies to be actuated and the magnitude of the force to be exerted on the photo-mask by the respective selected actuator assemblies can be determined by data showing the relationship between a magnitude of force and a resulting amount of deformation of the photo-mask, and by the detected positional errors.

Only the actuator assemblies that are arranged on one of the opposing two sides of the rectangular photo-mask may be actuated.

A distance between any two of the positioning marks on the photo-mask may be made slightly smaller or greater than that between corresponding ones on the substrate so that the positional errors between the positioning marks on the photomask and the corresponding positioning marks on the substrate are corrected to the predetermined values after the photo-mask is elastically stretched or compressed.

This invention also provides an alignment method comprising the steps of: providing a photo-mask on which a pattern is drawn and which has a plurality of positioning marks; memorizing positions of the positioning marks of the photo-mask as reference values; arranging in a first station a substrate which has a plurality of positioning marks corresponding to the positioning marks on the photo-mask, and arranging the photo-mask in a second station; detecting positions of the positioning marks on the substrate in the first station with a detecting device; determining positional errors between the positioning marks on the photo-mask and the corresponding positioning marks on the substrate by comparing the detected positions of the positioning marks on the substrate with the reference values; and exerting a force on one or more parts of a periphery of the photo-mask in the second station in accordance with the determined positional errors to elastically deform the photo-mask in its plane so that the determined positional errors are corrected to predetermined values.

This invention also provides an alignment method in an exposing process comprising the steps of: arranging in a first station a substrate which has a plurality of positioning marks, and arranging in a second station a photo-mask on which a pattern is drawn and which has a plurality of positioning marks corresponding to the positioning marks on the photo-mask; arranging in the first station a reference member which has a plurality of positioning marks equivalent to the positioning marks on the photo-mask so as to face the substrate; detecting positional errors between the positioning marks on the reference member and the corresponding positioning marks on the substrate in the first station; and exerting a force on one or more parts of a periphery of the photo-mask in the second station in accordance with the detected positional errors to elastically deform the photo-mask in its plane so that the detected positional errors are corrected to predetermined values.

Further, this invention provides an alignment apparatus to be used in an exposing process comprising: a device for holding a substrate which has a plurality of positioning marks so that a surface to be exposed of the substrate faces a photo-mask on which a pattern is drawn and which has a plurality of positioning marks corresponding to the positioning marks on the substrate; a device for detecting positional errors between the positioning marks on the photo-mask and the corresponding positioning marks on the substrate; and a device for exerting a force on one or more parts of the periphery of the photo-mask to elastically deform the photo-mask in its plane so that the positional errors are corrected to predetermined values.

The detecting device may include a CCD camera directed to the positioning marks on the photo-mask and on the substrate.

The device for exerting a force may include a plurality of actuator assemblies which are mounted along the periphery of the photo-mask and which can be actuated individually, and each of the actuator assemblies may have a device for connecting it to the periphery of the photo-mask.

The actuator assemblies may include air cylinder actuators.

The alignment apparatus may further comprise a processor for selecting appropriate actuator assemblies to be actuated and determining a magnitude of force to be exerted on the photo-mask by each of the selected actuator assemblies in order that the positional errors detected by the detecting device are corrected to the predetermined values. The selecting and the determining may be made on the basis of data showing the relationship between a magnitude of force and an amount of deformation of the photo-mask and on the basis of the positional errors detected.

The connecting device of each of the actuator assemblies may be mounted for rotation by a center pin which extends perpendicularly to a plane containing a surface of the photo-mask.

Each of the actuator assemblies can move laterally to the direction of the actuation thereof.

The connecting device of each of the actuator assemblies may include a pair of clamping members. Each of the clamping members may include a plurality of elongate projecting parts having rectangular cross sections and being spaced by one or more grooves extending along the direction of actuation of the actuator assembly. In the case that the projecting parts are made of elastic material, each pair of clamping members are able to clamp the periphery of the photo-mask with opposed surfaces of the projecting parts. The projecting parts are difficult to deform when receiving forces from the photo-mask along the direction of actuation of the actuator assemblies, but can easily deform elastically when they receive forces from the photo-mask laterally to the direction of actuation of the actuator assemblies to allow sideways movement of the photo-mask while clamping it.

The connecting device of each of the actuator assemblies may include a block having a vacuum-suction hole against which one surface of the periphery of the photo-mask is placed and held by suction.

The connecting device of each of the actuator assemblies may include a block having an adhesive layer, against which one surface of the periphery of the photo-mask is placed and held by adhesion.

The block may include a plurality of elongate projecting parts having rectangular cross sections and being spaced by one or more grooves extending along the direction of actuation of the actuator assembly. In the case that the projecting parts are made of elastic material, one surface of the periphery of the photo-mask can be placed against surfaces of the projecting parts. The projecting parts are difficult to deform when receiving force from the photo-mask along the direction of actuation of the actuator assemblies, but can easily deform elastically when they receive force from the photo-mask laterally to the direction of actuation of the actuator assemblies to allow sideway movement of the photo-mask while holding it.

The photo-mask may be cut off at four corners that do not touch the connecting means of the actuator assemblies.

A plurality of apertures may be formed in the periphery of the photo-mask, and the connecting means of each of the actuator assemblies may include a protruding member which can be inserted into the aperture and which is engageable with an edge of the photo-mask defining the periphery of aperture.

The connecting means may include a clamping mechanism for clamping the photo-mask, and the protruding member may be one of parts of the clamping mechanism.

The alignment apparatus may further comprise a lens system for forming an image of the pattern of the photo-mask on the substrate. The lens system is disposed between the photo-mask and the substrate.

It should be noted that the term "predetermined value" to which the positional errors corrected in the last step of the alignment process refers to a "compensating value" of a magnitude which may be zero or some other value. Typically, however, the "predetermined value" is zero. In this case, when the positioning marks on the photo-mask are completely coincident with the positioning marks on the substrate, the proper alignment between the photo-mask and the substrate is achieved. However, in the case that the positioning marks on the substrate move due to, e.g., the contraction or expansion of the substrate which may occur in the later heat treatment process or other processes, the photo-mask and the substrate are considered to be properly aligned when the relative displacement beween the positional mark on the substrate and the positioning marks on the substrate and the positioning marks on the photo-mask corresponds to certain compensating values which can be predetermined on the basis of data on the expected displacement of the positioning marks on the substrate.

According to the present invention, proper alignment between a substrate and a photo-mask is achieved by the following steps. First, the photo-mask is held by a photo-mask holding device. The photo-mask may be film-like, sheet-like or plate-like. The configuration of the photo-mask may be rectangular or circular. On the photo-mask, a pattern has been drawn and a plurality of positioning marks are provided. Next, the substrate is held by the substrate holding device so that its surface to be exposed faces the photo-mask. On the substrate, a plurality of positioning marks are provided at locations corresponding to those of the photo-mask. The photo-mask and substrate are placed so that each positioning mark on one of the photo-mask and the substrate faces the corresponding positioning mark on the other. The detecting device detects positional errors between the corresponding positioning marks on both members. Then, a force is exerted by a force generating or exerting device on one or more parts of the periphery of the photo-mask to elastically deform the photo-mask in its plane. In the case that the photo-mask is film-like or sheet-like, it can be stretched. In the case that the photo-mask is plate-like, it can be stretched or compressed. Deformation of the photo-mask moves the positioning marks thereon, until the positional errors between the positioning marks on the photo-mask and the positioning marks on the substrate are corrected to predetermined values, namely, predetermined compensating values including zero. When the respective positional errors in all of the pairs of the corresponding positioning marks are corrected to the respective predetermined values, the photo-mask is properly aligned with the substrate.

The detection of the positional errors and the deformation of the photo-mask may be repeated more than one time.

As a detecting device, a CCD camera may be used to take a picture of the positioning marks on the photo-mask and the substrate. The positional errors can be determined by processing image signals from the CCD camera.

A plurality of actuator assemblies may be used as a force exerting device. The actuator assemblies are mounted along the periphery of the photo-mask and can be individually actuated. Each actuator assembly has a connecting device on its one end for connecting itself to the periphery of the photo-mask. As an actuator assembly, an air cylinder device, a bellows actuator or a diaphragm actuator, all of which may be operable by positive pressure and/or negative pressure, can be used.

In some cases, not all of the actuator assemblies must be actuated. Some actuator assemblies can be selectively actuated depending on the magnitude and the distribution of the positional errors. For instance, in the case that the photo-mask is rectangular, only the actuator assemblies which are installed along two adjacent sides of the rectangular photo-mask may be actuated.

A processor may be used to select the actuator assemblies to be operated and to determine the magnitude of the force exerted by the respective selected actuator assemblies on the photo-mask so that the positional errors are corrected to the predetermined values. The above selection and determination are based on the data showing the relationship between force and the amount of deformation of the photomask and also based on the positional errors detected by the detecting device.

It is preferable that the photo-mask can be easily deformed even when it is pulled simultaneously in two axial directions perpendicular to each other. This is achieved where the connecting device of the actuator assembly is rotatably mounted by a center pin which extends perpendicularly to the surface of the photo-mask, or where the respective actuator assemblies are mounted so as to move laterally to the direction of actuation thereof.

The connecting device of the actuator may be a pair of clamping bars which clamp the periphery of the photo-mask. Where the clamping bars have a plurality of elongate projecting parts of rectangular cross sections which are spaced from one another with one or more grooves, and the projecting parts extend in the direction of actuation of the actuator assemblies, the periphery of the photo-mask is clamped by the opposing surfaces of the projecting parts of the respective clamping bars. Since the projecting parts extend in the direction of actuation of the actuator assemblies and are made of elastic material, they do not tend to deform when receiving forces from the actuator. However, they are able to easily deform when they receive lateral forces across the direction of actuation of the actuator assemblies, allowing sideways movement of the photo-mask while clamping it. Thus, the photomask can easily be deformed even when it is pulled simultaneously in the two directions perpendicular to each other.

When a block having vacuum suction holes or an adhesive layer is used to hold one side of the periphery of the photo-mask with a vacuum or adhesive, such connecting device may be provided on only one side of the photo-mask.

In the case that the block has a plurality of elongate projecting parts as mentioned above, the photo-mask can easily be deformed even when it is pulled simultaneously in the two directions perpendicular to each other.

In the case that a plurality of apertures are formed in the periphery of the photo-mask, and protruding members, as connecting devices, are inserted into the apertures and engage edges defining the peripheries of the apertures, the photo-mask does not slip.

Further, in the case that the protruding member is a part of a clamping mechanism for clamping the photo-mask, the protruding member provides less damage to the edge defining the periphery of the aperture of the photo-mask.

Where the four corners of the photo-mask, which do not touch the connecting means of the actuator, are cut off, resistance against the stretch of the photo-mask is reduced, assuring free deformation with ease.

Upon completion of the appropriate alignment between the substrate and the photo-mask, exposure is carried out in which light (ultraviolet rays) is irradiated from the photo-mask side in order to transfer the pattern thereon to the substrate. The photo-mask and the substrate may be supported with an appropriate gap therebetween, or without any gap as the case may be. A lens system may be disposed between the photo-mask and the substrate so that an image of the pattern of the photo-mask is formed through the lens system on the substrate. In this case, a scaled-down pattern can be formed on the substrate.

After exposure, the force that has been exerted on the photo-mask is relieved, but a slight force is left thereon. After the exerted force is relieved, the photo-mask can return to its original condition due to its elasticity.

The substrate on which the pattern has been transferred is removed from the substrate holding device, and a new one is placed on the holding device. Another alignment is repeated for this new substrate, which could have deformation different from the previous one, in accordance with the aforementioned procedure.

According to another alignment method of the invention, the determination of the positional errors is conducted in one station and the photo-mask is deformed in another station so that the positional errors are corrected to the predetermined values. In this method, positions of the positioning marks on the substrate are detected in a first station. At the same time, the positional errors between the corresponding positioning marks on the photo-mask and the substrate are determined. In determining the positional errors, the positions of the positioning marks on the photomask, which have been previously detected, are memorized as reference values, and the detected positions of the positioning marks on the substrate in the first station are compared with the reference values. In another way of determining the positional errors, a reference member such as a master photomask is provided in the first station. The reference member has a plurality of positioning marks equivalent to the positioning marks of the photo-mask which is actually used in the exposure process, and the positional errors between the corresponding positioning marks on the substrate and the reference member are detected.

In accordance with the determined positional errors, a force is exerted on one or more parts of the periphery of the photo-mask disposed in a second station (exposure station) in order to elastically deform the photo-mask in its plane so that the determined positional errors are corrected to the predetermined values.

Subsequently, the substrate is transferred from the first station to the second station and is exposed therein. In succession, the substrates undergo the detection of the positions of the positioning marks in the first station and are transferred to the second station for exposure. On the other hand, the photo-mask stays in the second station and is deformed in accordance with the determined positional errors of the respective substrates to be exposed.

In accordance with this alignment method, while one substrate is exposed in the second station, the determination of the positional errors relative to the next substrate can be conducted in the first station. Therefore, the processing time per substrate is considerably reduced.

BRIEF DESCRIPTION OF THE DRAWINGS

FIG. 3 shows a method for correcting the positional errors between the positioning marks;

FIG. 4 shows another method for correcting the positional errors between positioning marks;

FIG. 8a is a fragmental side view of a block for holding a photo-mask;

FIG. 8b is a fragmental side view of another type of block for holding a photo-mask;

DETAILED DESCRIPTION OF THE PREFERRED EMBODIMENTS

Figure 1:
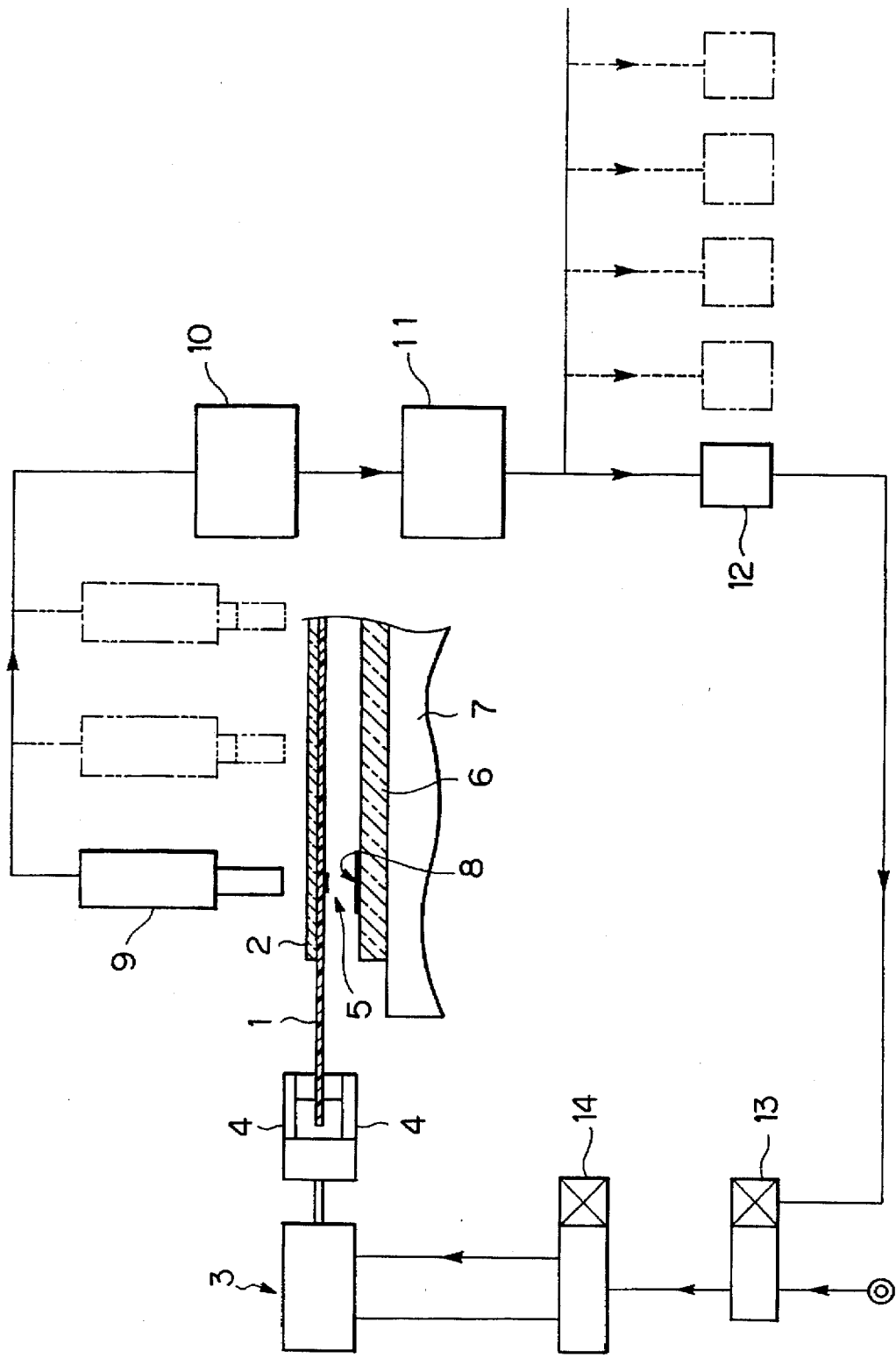
FIG. 1 is a schematic diagram of a system for carrying out an embodiment of an alignment method according to the invention.

FIG. 1 shows a preferred embodiment of a system for performing an alignment method of this invention. Referring to FIG. 1, the method of the invention will be explained below.

First, a photo-mask I is prepared. The photo-mask 1 is made of an elastic, expandable, transparent material such as a polyester film or a thicker polyester sheet. The photomask 1 is held by connecting devices each of which is attached to one of stretching units (actuator assemblies) 3 which are disposed around the photo-mask 1, while the photo-mask makes contact with a transparent plate 2, such as a glass plate, so that the surface of the photo-mask I is kept flat. In this preferred embodiment, air cylinder devices are used as the stretching units 3, and a pair of clamping bars 4 are used as connecting devices. Actuating the stretching units 3 causes the photo-mask 1 to be held with slight tension. The stretching units 3 as well as the transparent plate 2 function as supporting members for the photo-mask. At the same time, the stretching units 3 also function as actuators for exerting tensile forces on the photo-mask. A pattern is drawn at the center part of the photo-mask 1, and mask marks (positioning marks) 5 are provided at a plurality of locations close to the periphery thereof.

Subsequently, a substrate 6 is placed on a substrate holder (substrate supporting member) 7 so that it faces the photo-mask 1 with a very small gap therebetween. The substrate 6 can be held on the substrate holder 7 by vacuum suction. On the surface of the substrate 6 facing the photomask 1, a photo-sensitive film is provided to which the pattern on the photo-mask 1 is transferred at the time of exposure. On the periphery of the substrate 6, substrate marks (positioning marks) 8 are provided so that they correspond to the mask marks 5 of the photo-mask 1.

Generally used for the mask marks 5 and substrate marks 8 are black circles which are drawn on a transparent area and transparent circles, reflecting marks, through holes, etc. which are formed on a non-transparent area. Cross marks can also be used. A part of the pattern can be used as a positioning mark, too.

Next, a CCD camera 9 takes a picture of each pair of the mask mark 5 and the substrate mark 8. After image signals are processed by an image processing device 10, a positional-error calculating device 11 computes the amounts of the positional errors between the respective pairs of the marks to determine the amounts of the forces that must be exerted on the photo-mask 1 by the respective stretching unit 3 for the respective positional errors to be corrected to respective predetermined values, namely, compensating values. In order to enable this calculation, data showing the relationship between tensile force and the amount of expansion of the photo-mask 1 and other necessary data are stored beforehand in the positional-error calculating device 11.

The positional-error calculating device 11, then, computes air pressures necessary for each stretching unit 3 to apply required tensile forces to the periphery of the photomask 1. The results of the calculation are sent out in the form of signals to air pressure control devices 12 associated with the respective stretching units 3.

The signals are transferred from the air pressure control devices 12 to changing valves 14 of the respective stretching units 3 via air pressure regulators 13 of an electric-pneumatic conversion type to introduce the required pressure to each of the stretching units 3. Each stretching unit 3 pulls the periphery of the photo-mask 1 with the calculated tensile force. This causes the photo-mask 1 to stretch, and makes the mask marks 5 move so that the relative positions between the respective pairs of the marks 5, 8 change to the respective predetermined values. In the case that the predetermined value, namely, compensating value is zero, the mask mark 5 and the corresponding substrate mark 8 are aligned exactly.

If the relative positions between the mask marks 5 and the corresponding substrate marks 8 do not change to the predetermined values and some amount of positional error to be eliminated is left, this amount of the positional error is detected by the CCD camera 9 again and the foregoing processes are repeated.

After completing the alignment between the photo-mask 1 and substrate 6, exposure and transference of the pattern of the photo-mask 1 onto the substrate 6 are made by casting light (ultraviolet rays) onto the substrate 6 from the upper part of the system shown in FIG. 1. At this time, the substrate holder 7 may be moved toward the photo-mask 1 to make it contact firmly with the substrate 6 before exposure.

After exposure, the force on the photo-mask 1 is released to its original condition with slight tension, and the mask 1 is returned to its original condition. The substrate 6 is removed from the substrate holder 7 and replaced with a new one to be aligned.

Figure 2:
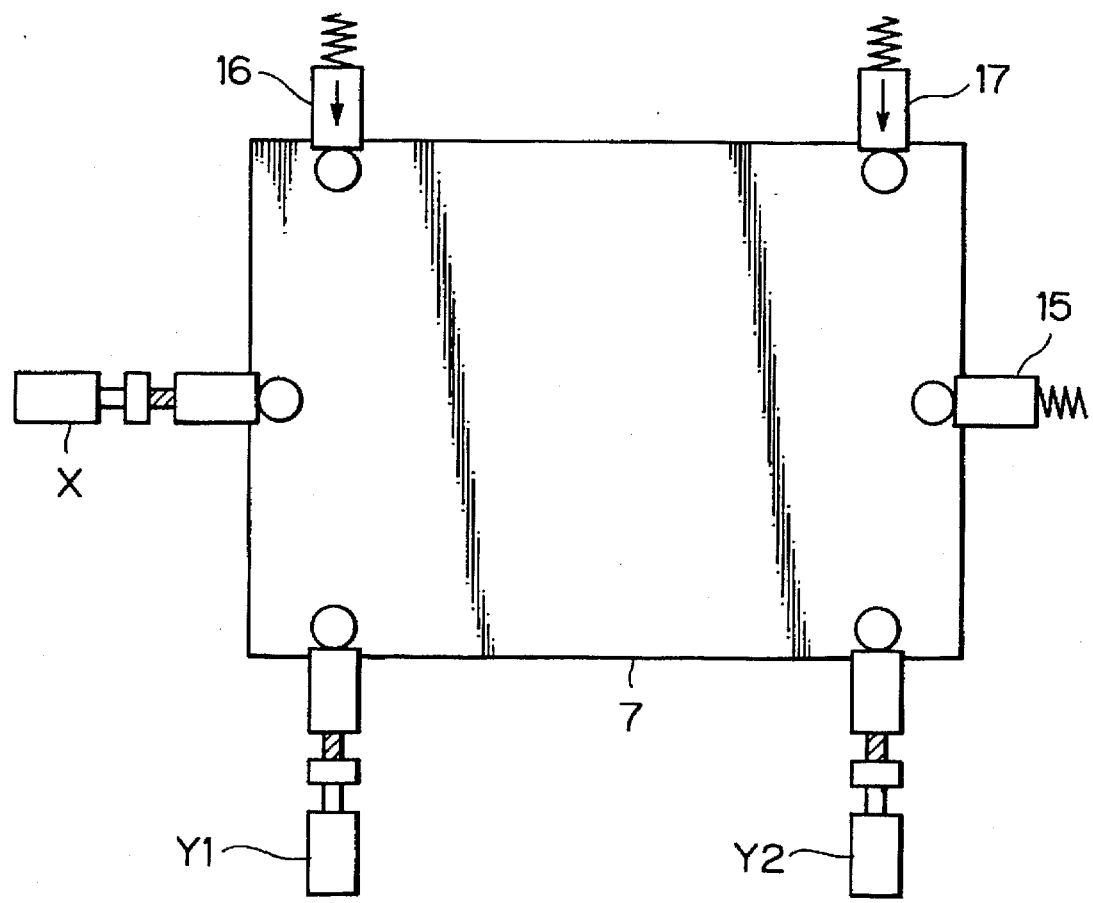
FIG. 2 is a schematic diagram of a mechanism of the system for sliding a substrate holder.

FIG. 2 shows a mechanism that slides the substrate holder 7. If the photo marks 5 and the corresponding substrate marks 8 are largely offset when the substrate 6 is placed on the substrate holder 7, the abovementioned sliding mechanism is used to average the positional errors between the paired marks. The sliding mechanism comprises a screw-type actuator X which is installed on one side of the substrate holder 7, two screw-type actuators Y1 and Y2 which are installed on another side next to it, and compression spring devices 15, 16 and 17 which are installed on the sides thereof opposite to the actuators X, Y1 and Y2, respectively. It is easily understood that the substrate holder 7 can be shifted along the directions of the X- and Y-axes perpendicular to each other as well as in a rotational direction by selectively actuating the actuators X, Y1 and Y2.

The left illustration of FIG. 3 shows the condition in which the average positional error between the mask mark 5 and the substrate mark 8 exists in each pair of the marks 5, 8. That is, the amounts of the positional errors in the respective pairs of the marks are the same, and the directions of the deviations are also the same, i.e. inwardly along the diagonal lines. As shown in the right illustration of FIG. 3, these positional errors are corrected to predetermined values by stretching the periphery of the photo-mask 1 with uniform tensile forces (the lengths of the arrows show the magnitudes of the tensile forces).

On the contrary, in the left illustration in FIG. 4, although the directions of the deviations of the respective positional errors are the same, i.e., inwardly along the diagonal lines, the amounts of the positional errors are not the same. In such a case, the positional errors are corrected to the predetermined values by providing different tensile forces on the photo-mask 1 along its periphery as shown in the right illustration of FIG. 4.

Figure 5:
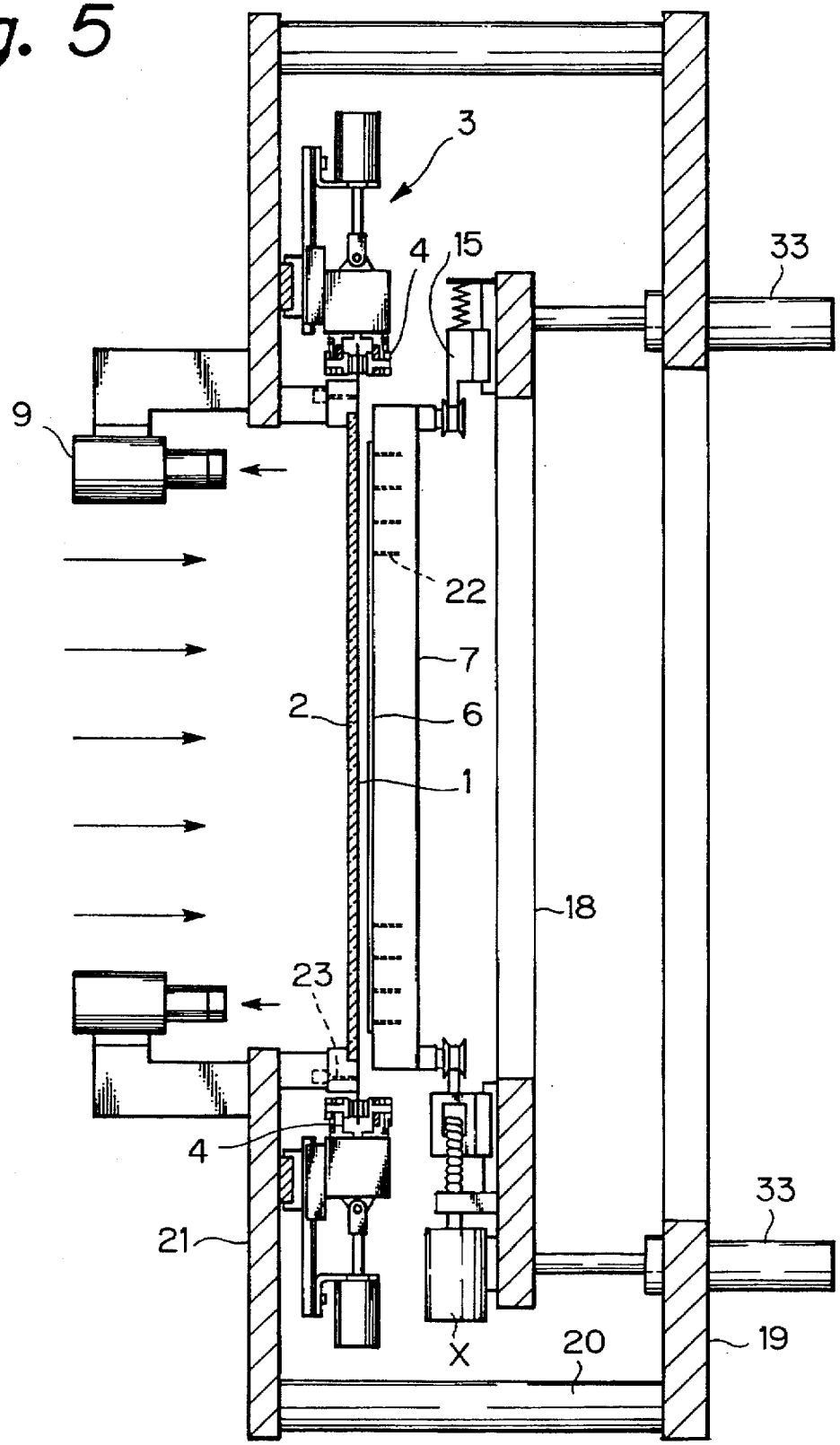
FIG. 5 is a sectional view of an embodiment of the alignment apparatus of the invention.
Figure 6:
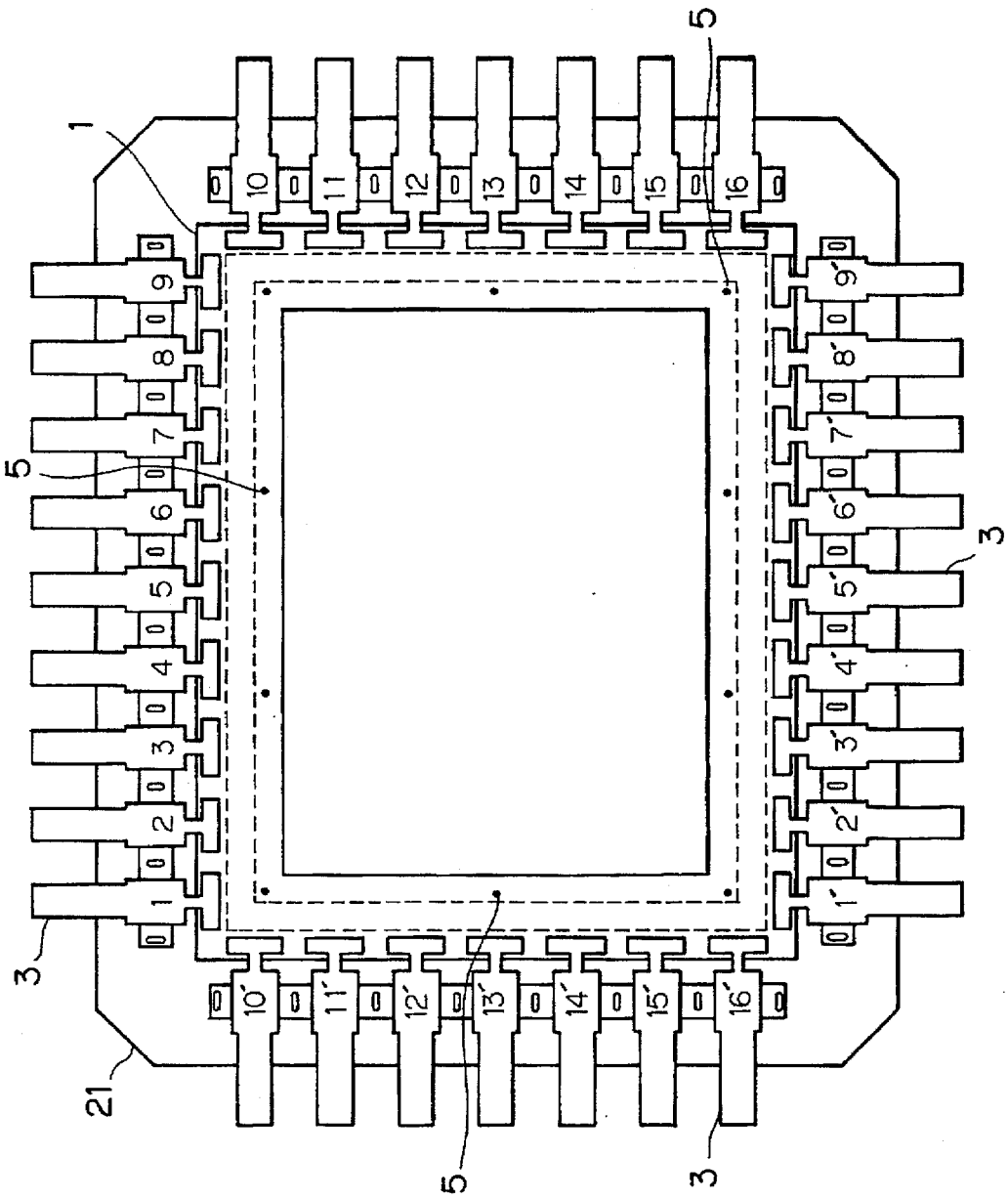
FIG. 6 is a plan view of a photo-mask held by stretching units at its periphery.

FIG. 5 is a sectional view of a preferred embodiment of an alignment apparatus of the invention. FIG. 6 is a front view illustrating a photo-mask 1 with its periphery held by stretching units 3. The same numeric symbols used in FIGS. 1 and 2 are also used here. The sliding mechanism (screw-type actuator X, compression spring device 15, etc.) for the substrate holder 7 is installed on a movable plate 18 and supports the substrate holder 7. On the other hand, the movable plate 18 is supported by ends of actuators 33 attached to a first base 19. Therefore, the actuation of the actuators 33 enables the substrate 6 on the substrate holder 7 to move toward or away from the photo-mask 1.

The CCD cameras 9 are attached to a second base 21 which is connected to the first base 19 via connecting rods 20. In FIG. 5, the CCD cameras 9 are located at places where they can take pictures of nearly the center of the substrate marks and the mask marks in order to detect the respective positional errors. However, to avoid interference during exposure, the cameras are rotated around their axes perpendicular to the second base 21 to assume positions outwardly of the photo-mask 1.

After the movable plate 18 is moved toward the first base 19, the substrate 6 is placed and fixed on the substrate holder 7 by a vacuum applied through a number of holes 22 in the substrate holder 7.

A similar vacuum suction system is utilized to temporarily fix the photo-mask 1. That is to say, when installing the photo-mask 1 on the alignment apparatus of the invention after the clamping bars 4 of the stretching units 3 are retracted, the periphery of the photo-mask 1 located on the transparent plate 2 is temporarily fixed to the second base 21 by a vacuum applied through the holes 23. Then, after the periphery of the photo-mask 1 is held by the clamping bars 4 of the stretching units 3 which have moved forward, the application of the vacuum through the holes 23 is halted. By introducing certain air pressure to the stretching units 3, the photo-mask 1 can be kept slightly stretched.

Upon completion of the installation of the photo-mask 1 and the substrate 6, the substrate 6 is moved toward the photo-mask 1 as shown in FIG. 5. While the CCD cameras take pictures of the respective pairs of the marks 5, 8, the substrate 6 is shifted by using the sliding mechanism as shown in FIG. 2 (screw-type actuator X, compression spring device 15, etc.) of the substrate holder 7 so that the positional errors of the respective pairs of the marks 5, 8 on the photomask 1 and the substrate 6 are averaged. At this time, the aforementioned image processing device 10 and the positionalerror calculating device 11 may be used.

By the procedure as described before, the positional errors are corrected to the predetermined values when the stretching units 3 are selectively actuated in accordance with the detected amounts of the respective positional errors. In this case, by actuating only the stretching units labeled by numerals 1 to 16 in FIG. 6, the positional errors can be corrected to the predetermined values. The stretching units labeled by numerals 1' to 16' in FIG. 6 need not be actuated.

The distances between the mask marks 5 may be made equal to those between the corresponding substrate marks 8. However, it is preferable to make the distances between the mask marks 5 slightly smaller than those between the substrate marks 8. In such a case, the distances between any two mask marks 5 never become greater than that between the corresponding substrate marks 8 even when there are some dimensional variations due to errors in production and, therefore, the positional errors between the mask marks 5 and the substrate marks 8 can be corrected to the predetermined values by stretching the the photo-mask 1 one time.

Figure 7:
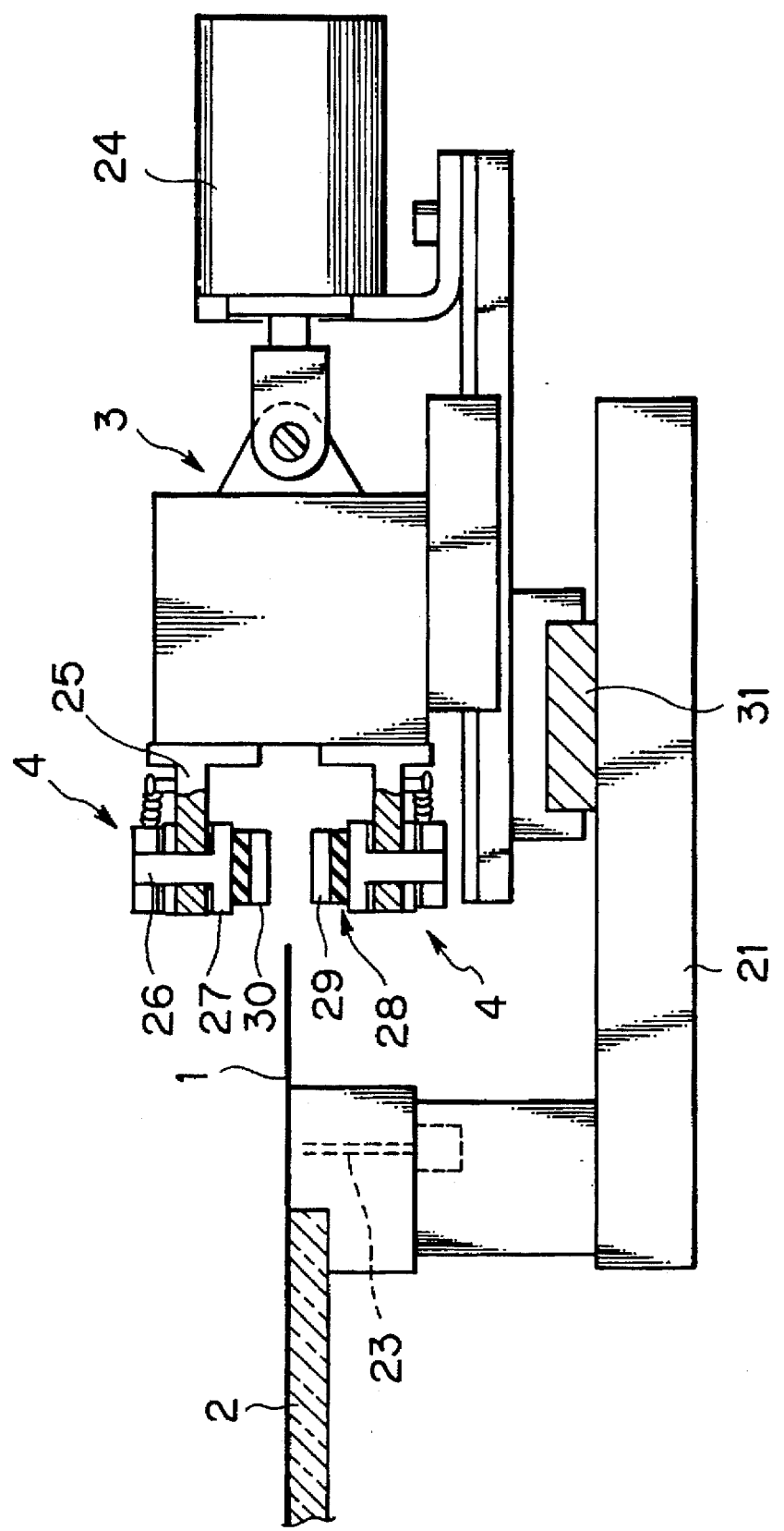
FIG. 7 is an enlarged side view of a stretching unit with its clamps being open.

FIGS. 7, 8, 9 and 10 are enlarged drawings of the stretching unit 3. The stretching unit 3 is shown in FIG. 7 with the clamping bar 4 opened, and in FIGS. 8, 9 and 10 with the clamping bar 4 closed. Each stretching unit 3 has an air cylinder 24 and a pair of clamping bars 4 attached to one end of the rod of the air cylinder 24. A pair of clamping bars 4 are closed and opened while maintaining their parallel relationship by means of a mechanism (not shown) using an actuator (can be of an air cylinder actuator type) and levers. Each of the clamping bars 4 comprises a supporting member 25, a mount 27 and an elastic member 28 fixed to the mount 27. The mount 27 is secured to an inner end of a rotatable center pin 26 which extends through the support member 25.

Figure 10:
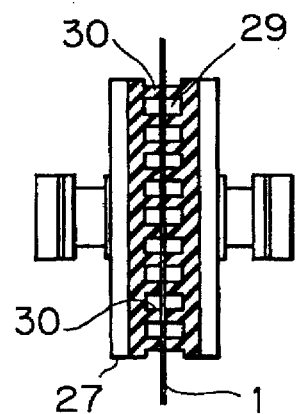
FIG. 10 is an enlarged front view of a stretching unit.

The elastic member 28 has a plurality of elongate projecting parts 30 each of which has a rectangular cross section (FIG. 10). The respective projecting parts 30 are spaced from each other with groves 29 extending in the direction of actuation of the stretching unit 3. The periphery of the photo-mask 1 is clamped between the opposed surfaces of the projecting parts 30 of the elastic members 28 of a pair of the clamping bars 4. Since the projecting parts 30 are elongate in the direction of actuation of the stretching unit 3, the projecting parts 30 will be hardly deformed when the stretching units 3 are actuated and the photo-mask 1 applied a tensile force to the projecting parts 30. However, when the stretching units disposed along the side adjacent to one on which the stretching unit 3 in question is disposed are actuated, the projecting parts 30 of the stretching unit 3 in question receive from the photo-mask 1 a force lateral to the direction of actuation of the stretching unit 3 in question. During such an occasion, the projecting parts 30 will be easily deformed transversely to allow a slight sideways movement of the photo-mask 1 while the projecting parts 30 clamp the photo-mask 1. Therefore, even if the photo-mask 1 is pulled from two axial directions simultaneously, the photomask can freely be stretched without difficulty.

Since the entire stretching unit 3 is mounted on the second base 21 via a slide bearing device 31, the unit 3 can move sideways (that is, in the direction perpendicular to the paper in FIG. 7).

Furthermore, because the elastic member 28 is secured to the inner end of the center pin 26 which is rotatable relative to the supporting member 25, the elastic member 28 can rotate in response to any skewed force exerted by the photo-mask 1.

The aforementioned mechanisms also assure free stretching of the photo-mask 1 without difficulty.

As a stretching unit for applying a tensile force to the periphery of the photo-mask 1, mechanisms utilizing screws and springs may also be used with or without the air cylinders.

These stretching units can be actuated individually when applying tensile forces to the periphery of the photo-mask 1. When moving toward or moving away from the periphery of the photo-mask 1, a plurality of the stretching units may be operated by a single actuator.

In addition to actuators utilizing positive pressure, those utilizing negative pressure may also be used as stretching units. For instance, an air cylinder device, a bellow device and a diaphragm device, all of which can utilize positive and/or negative pressure, may be used as an actuator.

In place of a pair of the clamping bars 4, a block 4a (FIGS. 8a and 8b) may be used on one side of the periphery of the photo-mask 1. In the embodiment in FIG. 8a, the block 4a has therein a hole (not shown) through which the vacuum-suction is effected to hold the periphery of the photo-mask 1 on the block 4a. In the embodiment in FIG. 8b, an adhesive layer (A) is provided on the upper surface of the block 4a and the photo-mask 1 is held on the block 4a by adhesion.

The configuration of such a block may be the same as one of the pair of the clamping bars 4 (e.g. such as the lower one shown in FIG. 7), and a vacuum-suction hole or an adhesive layer (e.g. adhesive tape) may be used in the projecting parts 30 of the elastic member 28.

Figure 11:
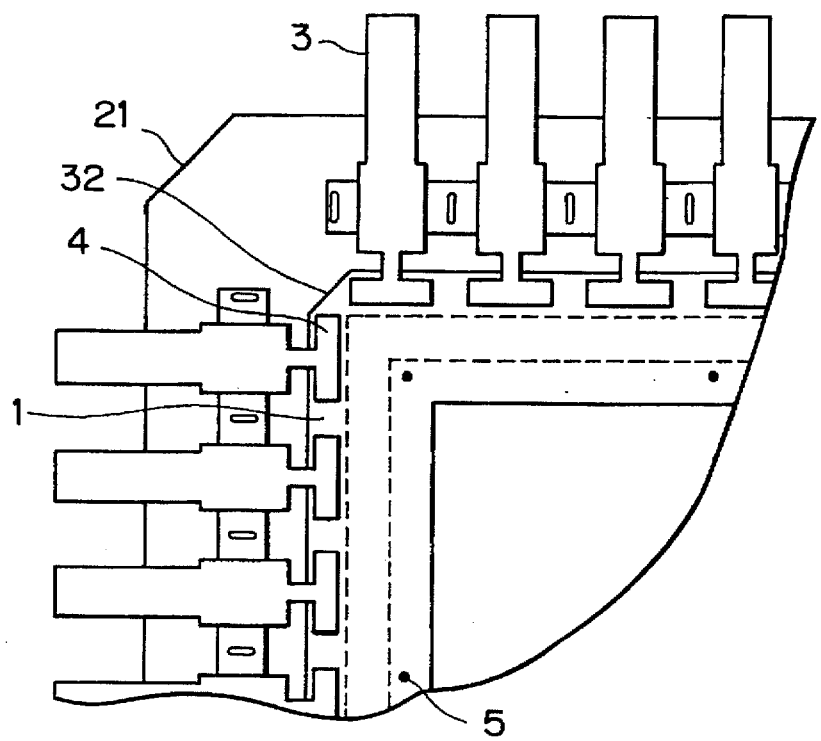
FIG. 11 is an enlarged plan view of the preferred embodiment in which the corner of a photo-mask is cut off.
Figure 12:
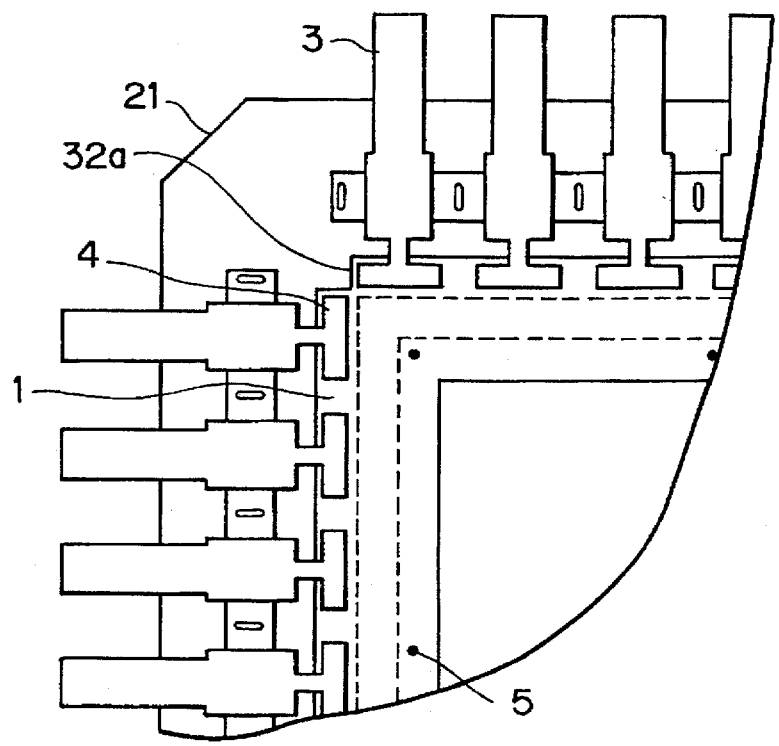
FIG. 12 is an enlarged plan view of another embodiment in which the corner of a photo-mask is cut off in a different manner.

As shown at 32 in FIG. 11 and at 32a in FIG. 12, the four corners of the photo-mask 1, where the clamping bars 4 (or the above-mentioned blocks 4a) of the stretching units 3 do not touch, may be cut off.

Figure 13:
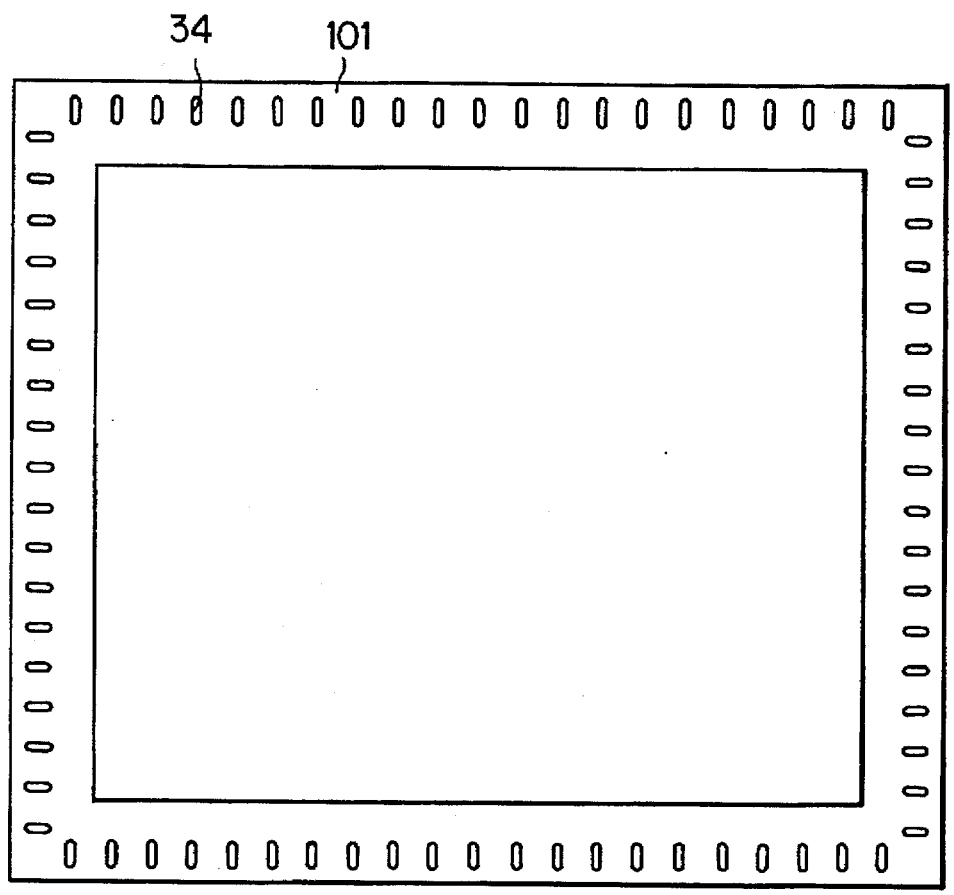
FIG. 13 is a plan view of a photo-mask having slots at its periphery.

FIG. 13 shows a photo-mask 101 of another type in which a plurality of apertures or slots 34 are formed in the periphery of the mask 101. For the photo-mask of this type, a stretching unit 103 of another type as shown in FIGS. 14–18 can be used as an actuator assembly. The stretching unit 103 has three pull-bars 36 which can be actuated by a single actuator 35 (such as an air cylinder device, a bellow or diaphragm device utilizing negative pressure, etc.). One, two or more than four pull-bars 36 may be provided in the stretching unit 103. The pull-bars 36 extend through holes formed in a plate 39 which is secured to both an end of a rod 37 of the actuator 35 and linear bearings 38. The pull-bars 36 are connected to the plate 39 through compression springs 40. The springs 40 are provided for balancing a plurality of the pull-bars 36. Therefore, if one actuator 35 is used for one pull-bar 36, the springs 40 can be eliminated.

A generally L-shaped protruding member or hook member 42 is provided In a hole formed in an inner end portion of the pull-bar 36. The hook member 42 is set in the hole by means of a compression spring 41. A complete rotation of the hook member 42 is prevented by a stop pin 43.

Figure 15:
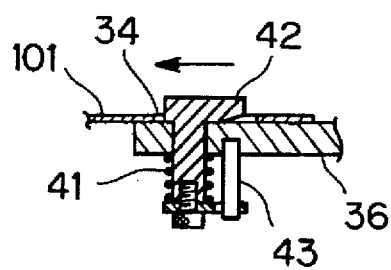
FIG. 15 is a fragmental side view of the stretching unit shown in FIG. 14.
Figure 16:
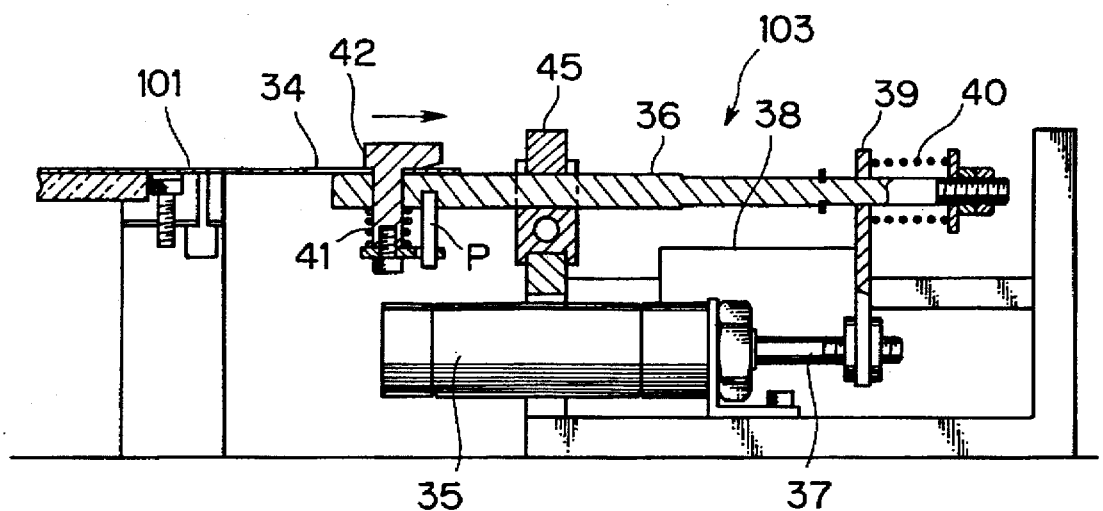
FIG. 16 is a side view of the stretching unit shown in FIG. 14.

After the rod 37 of the actuator 35 is retracted, the hook member 42 is inserted into the slot 34 of the photomask 101, as shown in FIG. 15. Then, the rod 37 of the actuator 35 is extended so that the hook member 42 engages an edge defining the slot 34, as shown in FIG. 16. At the same time, the photo-mask 101 is clamped between the hook member 42 and the pull-bar 36 under the action of the compression spring 41.

Figure 17:
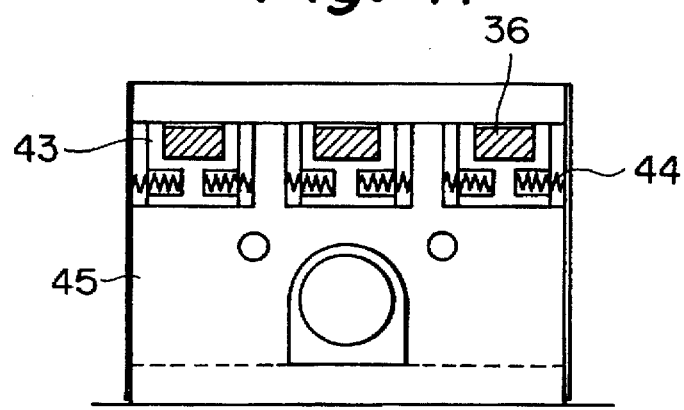
FIG. 17 is a sectional view taken along line A—A in FIG. 14.

As shown in FIG. 17, each pull-bar 36 is slidably guided by a slide guide 43. The slide guide 43 is supported in an aperture of a guide plate 45 in a floating condition by means of springs 44. Therefore, the respective pull-bars 36 and hook members 42 can individually move laterally.

Figure 18:
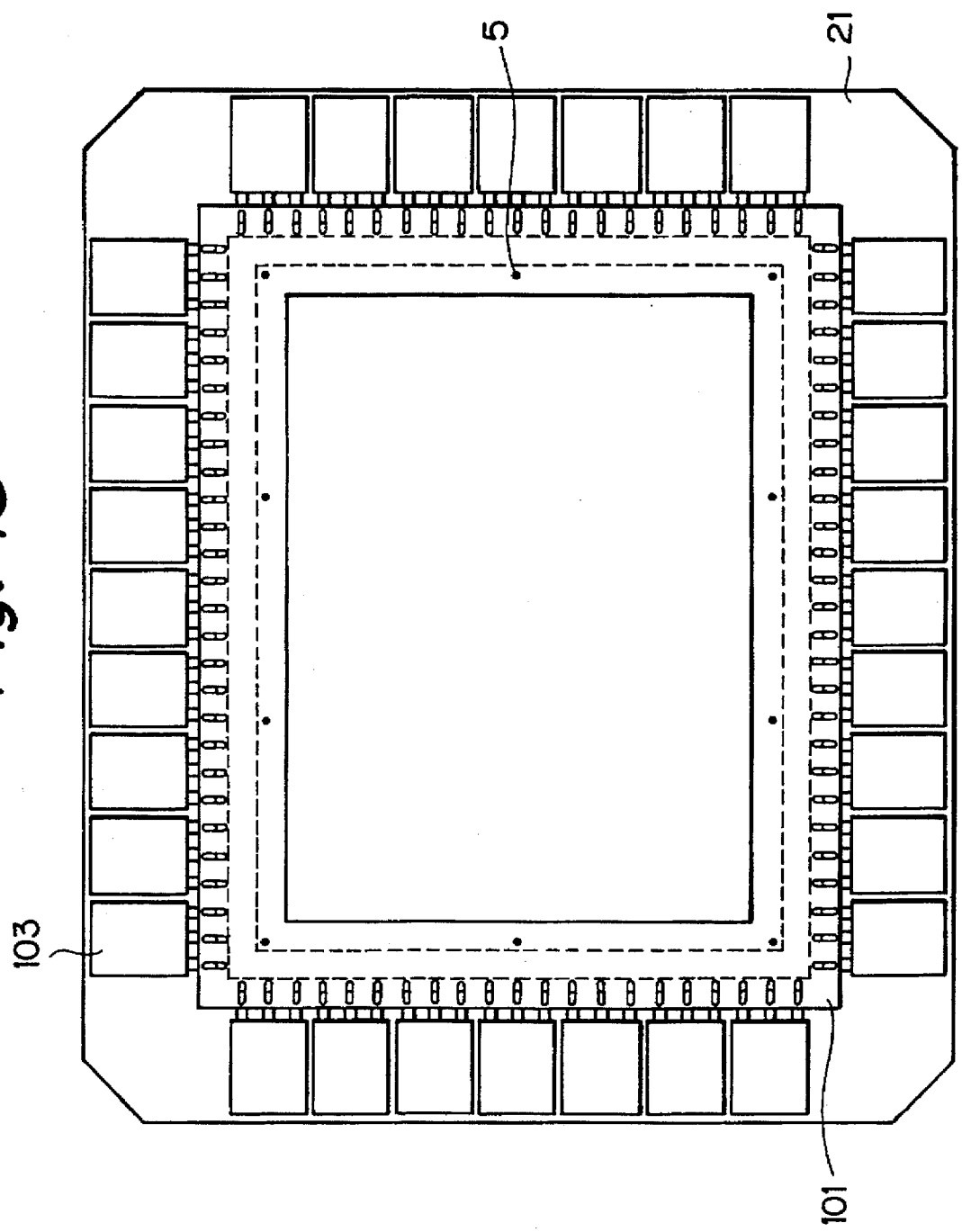
FIG. 18 is a plan view of stretching units which are disposed around the periphery of the photo-mask having slots.
Figure 19:
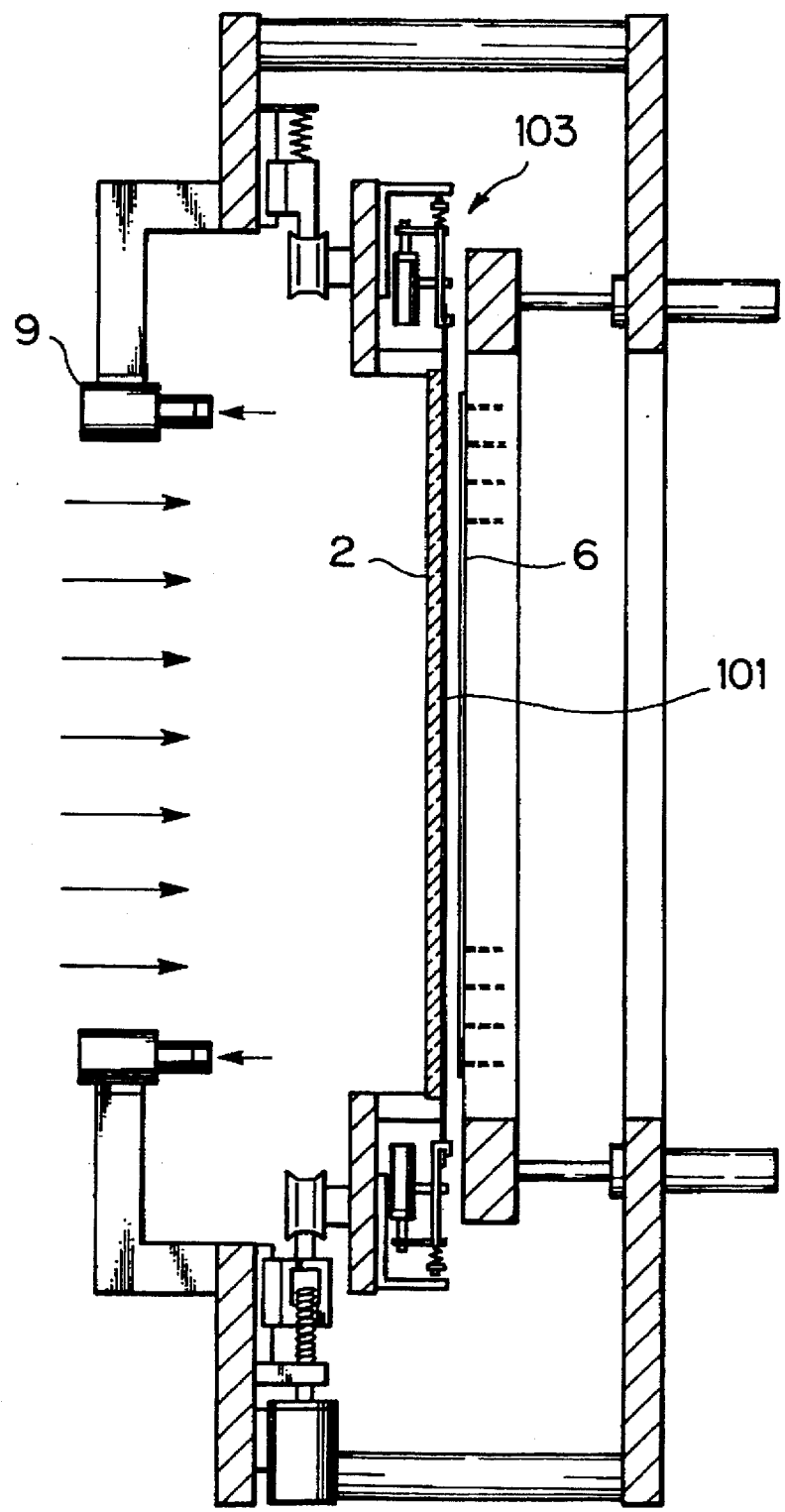
FIG. 19 is a side sectional view of an embodiment of an alignment apparatus, according to the invention, in which a photo-mask having slots is used.
Figure 20:
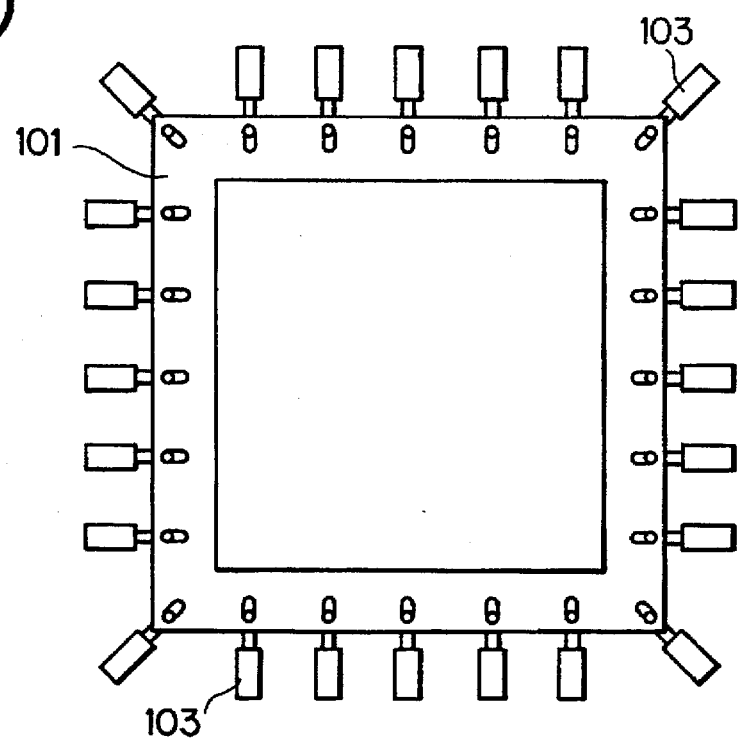
FIG. 20 is a view similar to FIG. 18, but shows another embodiment.

FIG. 18 shows the periphery of the photo-mask 101 having the slots being held by the stretching units 103, and FIG. 19 shows an alignment apparatus in which the photo-mask 101 having the slots held by the stretching units 103.

The stretching units 103 may be provided at the four corners of the rectangular photo-mask 101, as shown in FIG.

Figure 21:
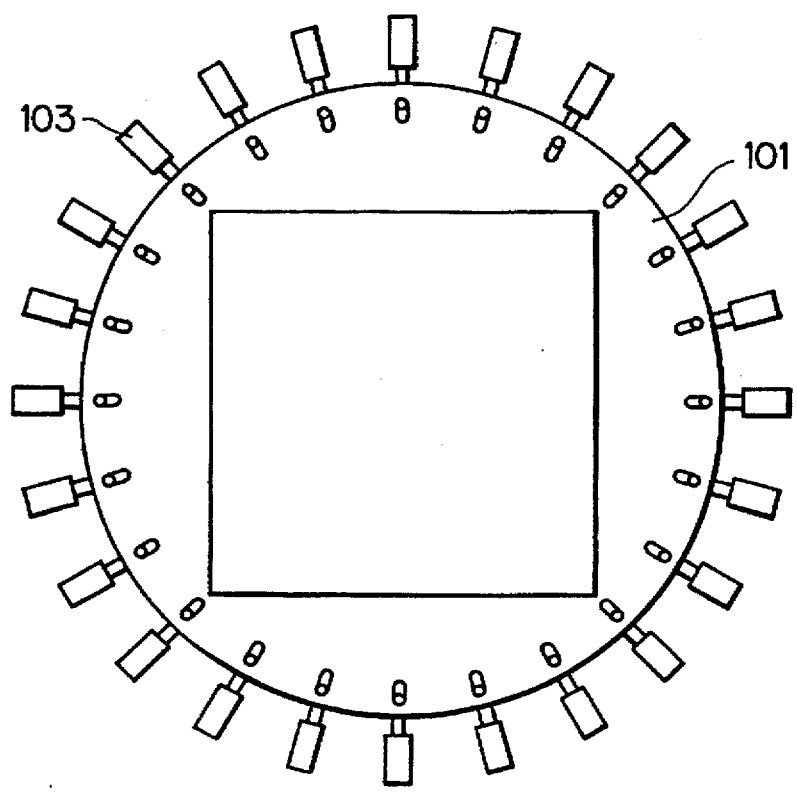
FIG. 21 is similar to FIG. 18, but shows still another embodiment.

20. If a circular photo-mask 101 as shown in FIG. 21 is used, the stretching units 103 may be disposed along the periphery thereof with any distance between the units 103.

In place of the slots 34, circular apertures may be used. In this case, a straight pin member can be substituted for the hook member 42 of the stretching unit 103, and the photo-mask 101 need not be clamped. The periphery of the circular aperture is preferably reinforced by an appropriate member, such as an eyelet.

The embodiments of the invention have been described with respect to a film-like photo-mask and a thicker sheet-like photo-mask which are easily stretched by tensile forces. However, this invention can also be applied to a plate-like photo-mask, such as a thick acrylic resin plate, which can be deformed by compression forces. As an actuator assembly for such a plate-like photo-mask, an actuator which can apply only compression forces or an actuator which can apply both compression and stretching forces can be used. These actuators can apply the compression forces to one or more parts of the periphery of the plate-like photo-mask to elastically deform it so that the positional errors between the corresponding positioning marks of the photo-mask and the substrate are corrected to the predetermined values.

Figure 22:
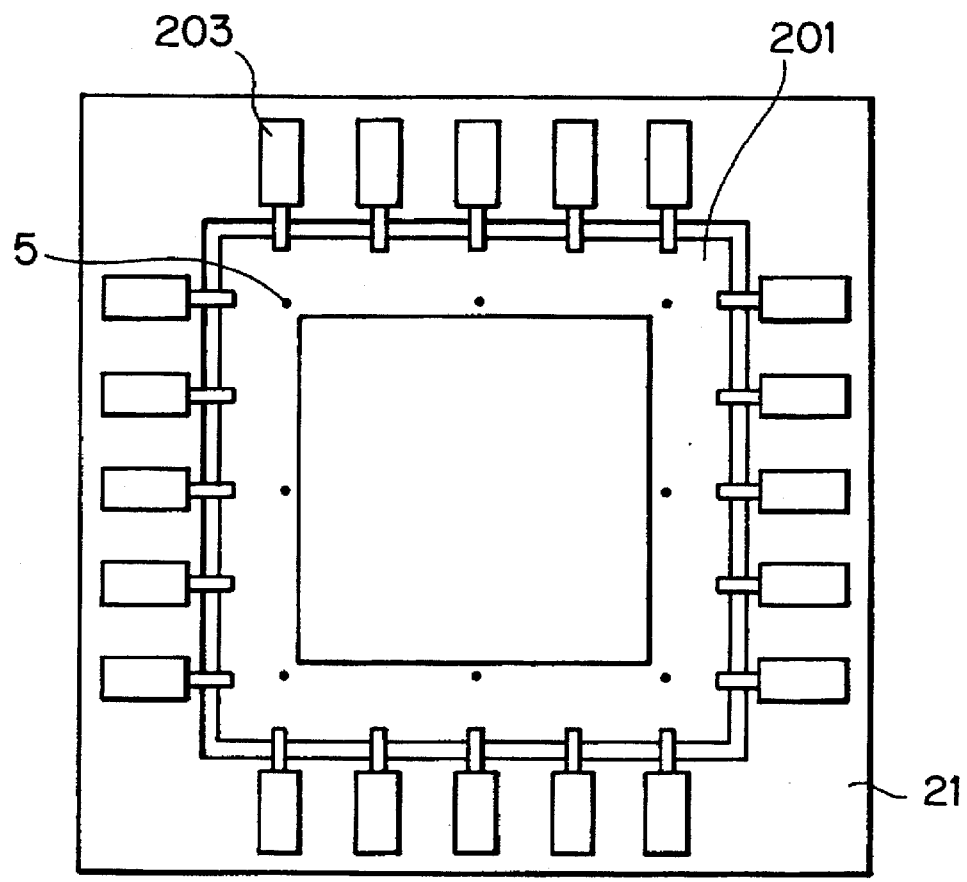
FIG. 22 is a plan view of actuator assemblies which can carry out a push-and-pull operation and are disposed around the periphery of a plate-like photo-mask.
Figure 23:
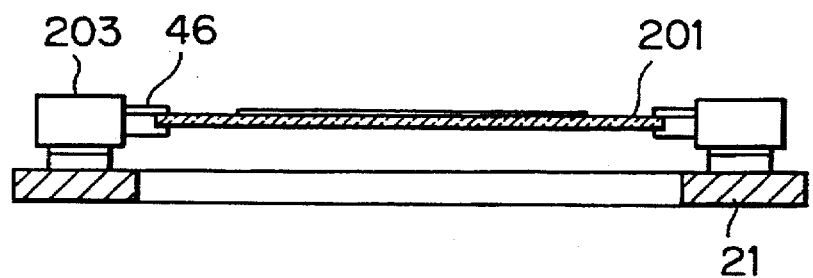
FIG. 23 is a side view of the photo-mask and the actuator assemblies shown in FIG. 22.

FIGS. 22 and 23 show a plurality of actuator assemblies 203 that are disposed along the periphery of a platelike photo-mask 201. Each actuator assembly can apply a compression force and a tensile force. A clamping mechanism 46 is provided at a fore end of the actuator assembly 203. Therefore, the actuator assembly 203 can compress the photomask 201 to deform it and can stretch the mask 201 to deform it.

In the case that an actuator assembly which can apply only the compression force is used, the clamping mechanism can be eliminated.

The alignment method using the plate-like photo-mask and the actuator assemblies which can apply compression forces thereto is similar to the above-described alignment method using the film-like or sheet-like photo-mask and the stretching unit, except that the photo-mask receives the compression force at its periphery to elastically deform it.

Figure 24:
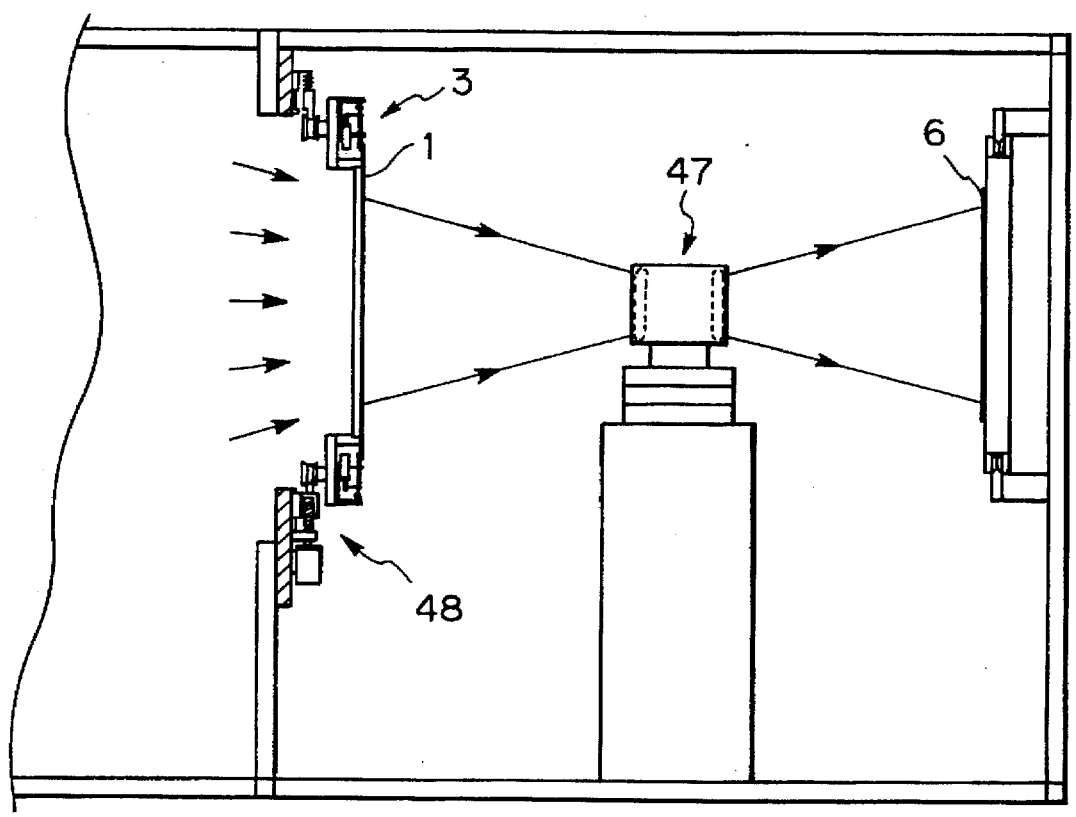
FIG. 24 is a side view of an embodiment in which a lens system is disposed between a photo-mask and a substrate.

FIG. 24 shows another embodiment in which a lens system 47 is disposed between the photo-mask 1 and the substrate 6. The pattern on the photo-mask 1 is reduced by the lens system 47 and a scaled-down or reduced pattern is exposed on the substrate 6. This method is advantageous in terms of precision and definition in comparison with the above-described method in which the photo-mask and the substrate are close to each other or in contact with each other. Since the reduction rate can be changed, this method is suitable for the exposure of a glass substrate for a semiconductor and a liquid-crystal display.

This embodiment has an alignment mechanism 48 similar to the mechanism shown in FIG. 2 and the stretching units 3 shown in FIG. 5. When the light is irradiated from behind the photo-mask 1, the pattern on the photo-mask 1 is reduced by the lens system 47 and an image of the reduced pattern is formed on the substrate 6.

Ultra violet rays are used as the light. During the alignment process, the ultra violet rays are preferably reduced to the minimum level at which the substrate 6 is not exposed but the CCD camera can take pictures of the positioning marks.

If the photo-mask moves after the proper alignment is achieved and before the exposure, the exposed substrates will make inferior goods. Therefore, it is preferable to fix the photo-mask after alignment. The photo-mask after alignment can be fixed by: (1) holding the periphery of the photo-mask with suction, (2) locking a part of the mechanism of the actuator assembly applying the force to the periphery of the photo-mask, (3) fixing the periphery of the photo-mask by means of a stop mechanism other than the actuator assembly applying the force to the periphery of the photo-mask, etc.

Figure 8:
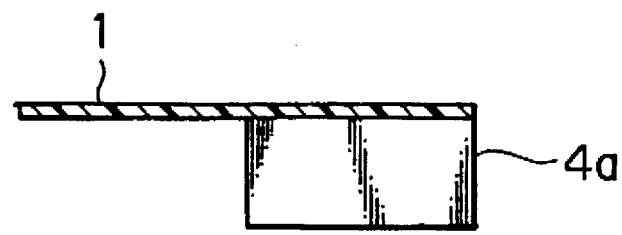
FIG. 8 is an enlarged side view of a stretching unit with its clamps being closed.
Figure 8:
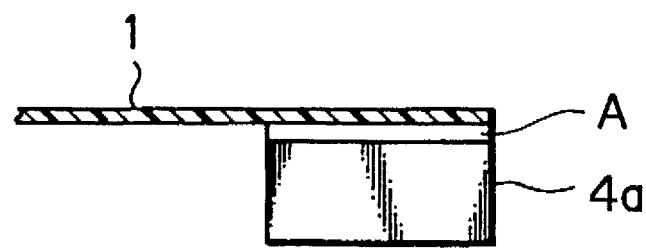
Figure 9:
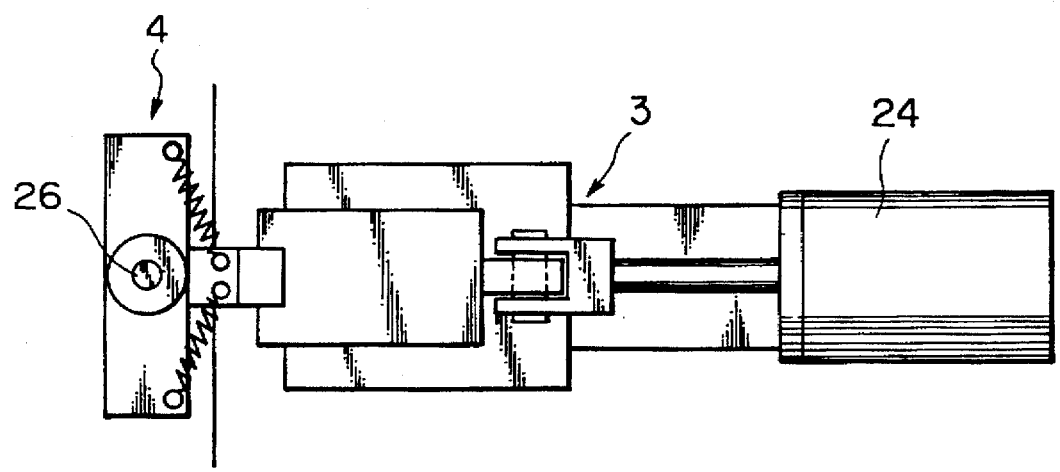
FIG. 9 is an enlarged plan view of a stretching unit.

The first step can be carried out by, for example, utilizing the holes 23 for temporarily holding the photo-mask as shown in FIGS. 7 and 8. After alignment, the vacuum is applied through the holes 23.

The second step can be carried out by, for example, locking the pull-bar 36 of the stretching unit 103 (FIGS. 14 and 16) by means of another actuator.

Figure 14:
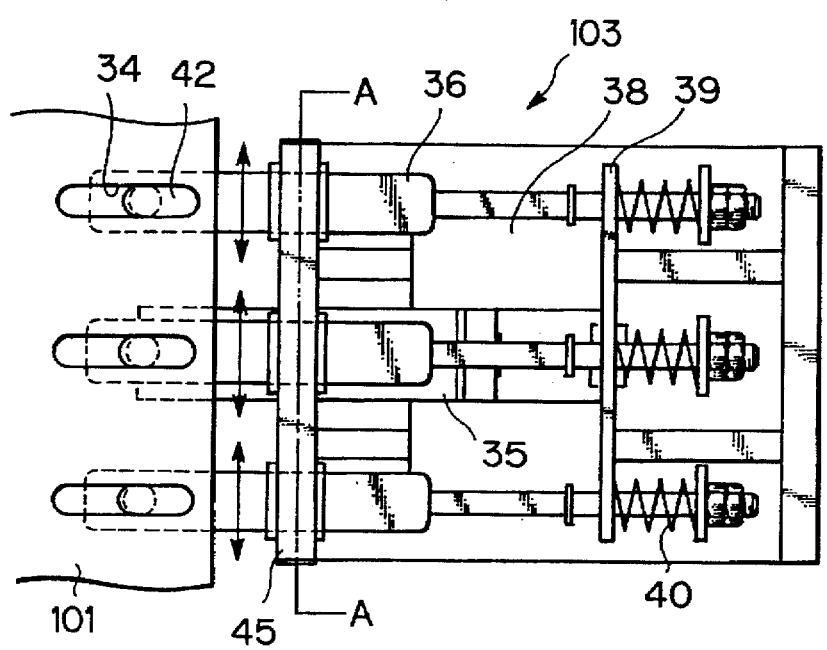
FIG. 14 is a plan view of one embodiment of a stretching unit.

The third step can be carried out by, for example, providing another clamping device between the pull-bars 36 of the stretching unit 103 (FIGS. 14 and 16). This clamping device can clamp the periphery of the photo-mask.

According to another alignment method of the invention, the determination of the positional errors is conducted in a first station and the photo-mask is deformed in a second station, and the positional errors are corrected to the predetermined values. This method can be carried out in two different ways.

Figure 25:
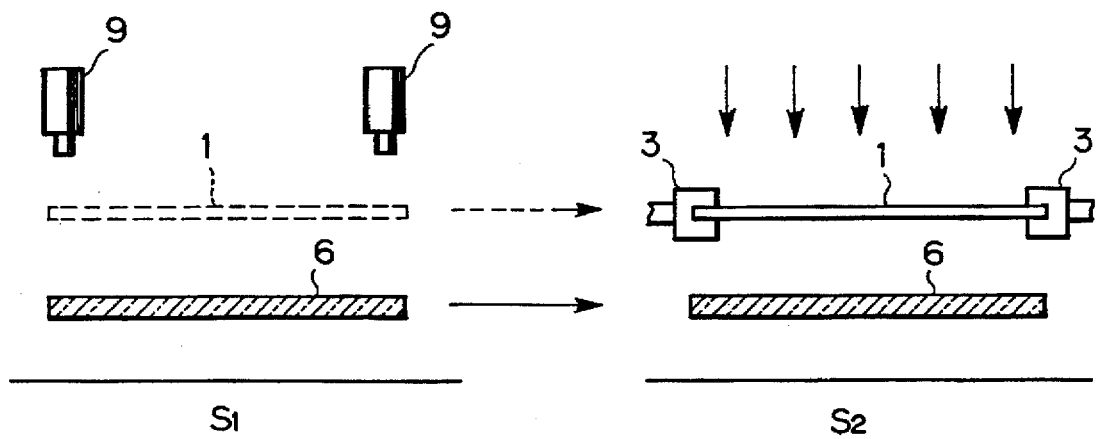
FIG. 25 is a schematic diagram showing another alignment method of the invention.

The first method will be described with reference to FIG. 25. The positions of the positioning marks on the photo-mask 1 are detected in advance in the first station (S1) by the CCD cameras 9. The detected positions are memorized as reference values. After the detection of the positioning marks on the photo-mask 1, the photo-mask 1 is transferred to the second (exposure) station (S2). Next, the positioning marks on the substrate 6 are detected in the first station (S1) by the CCD cameras 9 and thereafter the substrate 6 is transferred to the second station (S2). By comparing the detected positional errors with the reference values, the positional errors between the corresponding positioning marks on the substrate 6 and the photo-mask 1 are determined. In accordance with the determined positional errors, a force is exerted on one or more parts of the periphery of the photo-mask I disposed in the second station (S2) in order to elastically deform the photo-mask 1 in its plane so that the determined positional errors are corrected to the predetermined values.

Figure 26:
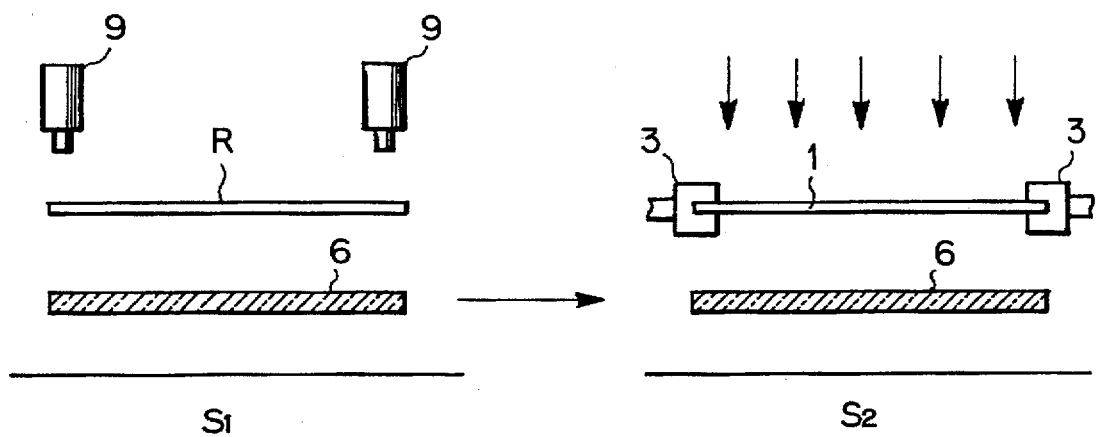
FIG. 26 is a schematic diagram view showing still another alignment method of the invention.

The second method will be described with reference to FIG. 26. A reference member (R) and the substrate 6 are disposed in the first station (S1). The reference member (R) may be a master photo-mask having a plurality of positioning marks equivalent to the positioning marks of the photo-mask which is actually used in the exposure process. The positional errors between the corresponding positioning marks on the reference member (R) and the substrate 6 are determined in the first station (S1) by means of the CCD cameras 9. Thereafter, the substrate 6 is transferred to the second station (S2). In accordance with the detected positional errors, a force is exerted on one or more parts of the periphery of the photo-mask 1 disposed in the second station (S1) in order to elastically deform the photo-mask 1 in its plane so that the detected positional errors are corrected to the predetermined values.

In either method, the positioning marks of the substrates 6 are detected in the first station (S1) and the substrates 6 are transferred to the second station (S2) for exposure, one after another. On the other hand, the photo-mask 1 stays in the second station (S2) and is deformed in accordance with the determined or detected positional errors of the respective substrates to be exposed. In these alignment methods, while one substrate is exposed in the second station (S2), the positional errors relative to the next substrate can be determined or detected in the first station (S1). Therefore, the processing time per substrate is considerably reduced.

The same reference values or the same reference member can be used to process a plurality of substrates. However, when, for example, one lot of the substrates have been processed and another lot is to be processed, new reference values which can be obtained by detecting the positioning marks on the photo-mask again may be used or a new reference member may be used for the new lot of the substrates.

In these methods, the exposure in the second station can be conducted without repeating the deformation of the photo-mask, because when the substrates are transferred from the first station to the second station for exposure and are disposed therein, the positional errors between the corresponding positioning marks on the substrate and the photo-mask, in most cases, have already been corrected to the predetermined values some tolerance. However, in the case that the CCD camera in the second station detects positional errors beyond the tolerance, the exposure is conducted after the photo-mask is deformed again in accordance with the detected positional errors so that the positional errors are corrected to the predetermined values.

The predetermined values may be set with taking the expected changes in temperature and humidity into consideration, because the photo-mask, especially a film-like photo-mask, is deformed by these changes.

What is claimed is:

1. An alignment method in an exposing process for aligning a planar photo-mask with a substrate having a plurality of reference marks thereon, said photo-mask having a pattern thereon, a plurality of positioning marks thereon corresponding to said reference marks, and a series of apertures formed along a periphery of said photo-mask, said method comprising the steps of:

providing a series of actuator members to surround said periphery of said photo-mask, each of said actuator members being actuatable individually and including a hook;

engaging said hooks with respective said apertures so as to hold said photo-mask;

arranging said substrate so that a surface thereof to be exposed faces said photo-mask;

detecting respective positional errors between said reference marks and said positioning marks; and actuating selected ones of said series of actuator means to exert a tensile force on one or more parts of said periphery of said photo-mask through the engagement between said hooks and said apertures to elastically deform said photo-mask in its plane so as to correct said positional errors to respective predetermined values.

2. The alignment method as claimed in claim 1, wherein said step of detecting said positional errors includes processing image signals from CCD cameras which are directed toward said positioning marks and said reference marks so as to detect errors in relative positions between said positioning marks and said reference marks.

3. The alignment method as claimed in claim 1, further comprising the steps of:

selecting respective said actuator members to be actuated and determining a magnitude of force to be exerted on said photomask by each of the selected said actuator members in order for said positional errors to be corrected to said predetermined values; and said selecting and said determining being made on the basis of data of the relationship between magnitudes of forces and resulting amounts that said photo-mask will deform when said forces are applied thereto, and on the basis of said positional errors detected.

4. The alignment method as claimed in claim 1, wherein said photo-mask has the shape of a rectangle, and only respective said actuator members that are arranged along one side of opposing two sides of said rectangular photo-mask are actuated.

5. The alignment method as claimed in claim 1, wherein a distance between any two adjacent of said positioning marks on said photo-mask is made slightly smaller than that between corresponding two said reference marks on said substrate so that said positional errors between said positioning marks and said reference marks will come to said predetermined values after said photo-mask is elastically stretched.

6. An alignment method in an exposing process for aligning a planar photo-mask with a substrate having a plurality of reference marks thereon, said photo-mask having a pattern thereon, a plurality of positioning marks thereon corresponding to said reference marks, and a series of apertures formed along a periphery of said photo-mask, said method comprising the steps of:

memorizing positions of said positioning marks of said photo-mask as reference values;

arranging said substrate in a first station and arranging said photo-mask in a second station;

providing a series of actuator members to surround said periphery of said photo-mask, each of said actuator members being actuatable individually and including a hook;

engaging said hooks with respective said apertures so as to hold said photo-mask;

detecting positions of said reference marks of said substrate in the first station by detecting means;

comparing the thus detected positions of said reference marks with said reference values to determine positional errors between said positioning marks and corresponding said reference marks; and actuating selected ones of said series of actuator members to exert a tensile force on one or more parts of said periphery of said photo-mask in said second station through the engagement between said hooks and said apertures to elastically deform said photo-mask in its plane so as to correct said positional errors to respective predetermined values.

7. An alignment method in an exposing process for aligning a planar photo-mask with a substrate having a plurality of reference marks thereon, said photo-mask having a pattern thereon, a plurality of positioning marks thereon corresponding to said reference marks, and a series of apertures formed along a periphery of said photo-mask, said method comprising the steps of:

arranging said substrate in a first station and arranging said photo-mask in a second station;

arranging a reference member in said first station so as to face said substrate, said reference member having a plurality of positioning marks thereon which are equivalent to said positioning marks of said photo-mask;

providing a series of actuator members to surround said periphery of said photo-mask, each of said actuator members being actuatable individually and including a hook;

engaging said hooks with respective said apertures so as to hold said photo-mask;

detecting respective positional errors between said positioning marks of said reference member and said reference marks of said substrate in said first station by detecting means; and actuating selected ones of said series of actuator members to exert a tensile force on one or more parts of said periphery of said photo-mask in said second station through the engagement between said hooks and said apertures to elastically deform said photo-mask in its plane so as to correct said positional errors to respective predetermined values.

* * * * *